(12) United States Patent
Chen et al.

(10) Patent No.: US 12,538,468 B2
(45) Date of Patent: Jan. 27, 2026

(54) METHOD OF FABRICATING SEMICONDUCTOR DEVICE WITH PROGRAMMBLE FEATURE

(71) Applicant: NANYA TECHNOLOGY CORPORATION, New Taipei (TW)

(72) Inventors: Yin-Fa Chen, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 841 days.

(21) Appl. No.: 17/825,480

(22) Filed: May 26, 2022

(65) Prior Publication Data
US 2023/0389272 A1 Nov. 30, 2023

(51) Int. Cl.
*H10B 12/00* (2023.01)

(52) U.S. Cl.
CPC .............. *H10B 12/09* (2023.02); *H10B 12/50* (2023.02); *H10B 12/053* (2023.02); *H10B 12/315* (2023.02); *H10B 12/482* (2023.02); *H10B 12/485* (2023.02)

(58) Field of Classification Search
CPC ...... H10B 12/09; H10B 12/50; H10B 12/482; H10B 12/485; H10B 12/053; H10B 12/315
See application file for complete search history.

(56) References Cited

U.S. PATENT DOCUMENTS

| 4,590,589 A | 5/1986 | Gerzberg |
| 2013/0256769 A1 | 10/2013 | Jeong et al. |
| 2014/0070291 A1* | 3/2014 | Song ............. H10B 12/315 438/270 |
| 2022/0130841 A1 | 4/2022 | Kim et al. |
| 2024/0023311 A1* | 1/2024 | Lee ............. H10D 30/673 |

FOREIGN PATENT DOCUMENTS

| CN | 1202982 A | 12/1998 |
| CN | 101288164 A | 10/2008 |
| TW | 406377 B | 9/2000 |
| TW | 202010127 A | 3/2020 |
| TW | 202115830 A | 4/2021 |
| TW | 202220170 A | 5/2022 |

OTHER PUBLICATIONS

Taiwanese Office Action dated May 26, 2023 in application No. 111127613, the search report attached to the Office Action; pp. 1-10.

* cited by examiner

*Primary Examiner* — Richard A Booth
(74) *Attorney, Agent, or Firm* — MUNCY, GEISSLER, OLDS & LOWE, P.C.

(57) ABSTRACT

The present application provides a method of manufacturing a semiconductor device. The method includes steps of providing a substrate comprising a first island and a second island, wherein the first island has a first area and the second island has a second area greater than the first area; depositing an insulative layer to cover the substrate; forming a conductive feature penetrating through the insulative layer and contacting the second island; and forming a conductive line on the insulative layer and connected to the conductive feature.

11 Claims, 25 Drawing Sheets

METHOD OF FABRICATING SEMICONDUCTOR DEVICE WITH PROGRAMMBLE FEATURE

TECHNICAL FIELD

The present disclosure relates to a method of fabricating a semiconductor device, and more particularly, to a method of fabricating a semiconductor storage device including a resistive circuit formed in a cell region of a substrate and providing a programmable resistor to a peripheral circuit of the semiconductor storage device in a peripheral region of the substrate.

DISCUSSION OF THE BACKGROUND

Generally, integrated circuits are mass-produced by forming many identical circuit patterns on a single silicon wafer. Integrated circuits, also commonly referred to as semiconductor devices, are made of various materials that may be electrically conductive, electrically nonconductive (insulators) or electrically semiconductive.

Random-access memory devices, such as dynamic random-access memories (DRAMs), include memory cells for storing data and peripheral circuits for switching signals to and from of the memory cells. In general, the memory cells are formed in a cell region of a substrate, and the peripheral circuits are formed in a peripheral region laterally enclosing the cell region. The cell region includes multiple active islands for the formation of the memory cells. However, the active islands at a periphery of the cell region may have incomplete profiles, so that no elements are formed in the periphery of the cell region.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a conductive line, a conductive feature and a plurality of memory cells. The substrate comprises a first island, a second island and an isolation structure disposed between the first island and the second island. The first island has a first area, and the second island has a second area greater than the first area. The conductive line is disposed over the substrate. The conductive feature connects the conductive line to the second island. The plurality of memory cells are disposed in or on the first island.

In some embodiments, the second island is closer to a periphery of the substrate than the first island.

In some embodiments, the second area is at least two times the first area.

In some embodiments, the first island has a first longitudinal axis, and the second island has a second longitudinal axis parallel to the first longitudinal axis.

In some embodiments, the conductive line extends along a first direction that intersects with the first longitudinal axis at an angle less than 90 degrees.

In some embodiments, the plurality of memory cells include a plurality of access transistors, a plurality of bitlines and a plurality of bitline contacts. The plurality of access transistors are disposed in the first island. The plurality of bitlines are disposed over the substrate, wherein the plurality of bitlines and the conductive line extend in a same direction. The plurality of bitline contacts connect the plurality of access transistors to the plurality of bitlines, respectively.

In some embodiments, the plurality of bitlines and the conductive line are disposed at a same horizontal level.

In some embodiments, the conductive feature and the plurality of bitline contacts are disposed at a same horizontal level.

In some embodiments, the semiconductor device further includes a plurality of storage capacitors and a plurality of storage node contacts. The plurality of storage capacitors are disposed over the plurality of access transistors, and the plurality of storage node contacts connect the plurality of storage capacitors to the plurality of access transistors, respectively.

In some embodiments, the substrate comprises an active zone and a dummy zone adjacent to the active zone, wherein the first island is located in the active zone and the second island is located in the dummy zone.

In some embodiments, the semiconductor device further includes a plurality of peripheral circuits located in a peripheral region of the substrate, wherein the dummy zone is located between the active zone and the peripheral region, and the second island functionally acts as a programmable resistor and is electrically coupled to at least one of the peripheral circuits through the conductive feature and the conductive line.

One aspect of the present disclosure provides a semiconductor chip. The semiconductor chip includes a cell region, a peripheral region, a plurality of memory cells, a plurality of peripheral circuits and a resistive circuit. The cell region comprises an active zone and a dummy zone adjacent to the active zone. The peripheral region is adjacent to the cell region, wherein the dummy zone is located between the active zone and the peripheral region. The plurality of memory cells are located in the active zone. The plurality of peripheral circuits are located in the peripheral region. The resistive circuit is located in the dummy zone and electrically coupled to the plurality of peripheral circuits.

In some embodiments, the semiconductor chip further includes a substrate where the plurality of memory cells, the plurality of peripheral circuits and the resistive circuit are disposed. A portion of the substrate in the active zone comprises a first island having a first area. A portion of the substrate in the dummy zone comprises a second island having a second area greater than the first area.

In some embodiments, the resistive circuit comprises the second island, a conductive line disposed over the substrate and electrically coupled to the plurality of peripheral circuits, and a conductive feature connecting the second island to the conductive line.

In some embodiments, the conductive line extends along a first direction, and the first island and the second island extend along a second direction different from the first direction.

In some embodiments, the semiconductor chip further includes a plurality of bitlines extending parallel to the conductive line and configured to electrically connect the plurality of memory cells to the plurality of peripheral circuits.

In some embodiments, the plurality of bitlines and the conductive line are at a same horizontal level.

In some embodiments, the substrate further includes an isolation structure disposed between the first island and the second island.

One aspect of the present disclosure provides a method of manufacturing a semiconductor device. The method includes steps of providing a substrate comprising a first island and a second island, wherein the first island has a first area and the second island has a second area greater than the first area; depositing an insulative layer to cover the substrate; forming a conductive feature penetrating through the insulative layer and contacting the second island; and forming a conductive line on the insulative layer and connected to the conductive feature.

In some embodiments, the substrate including the first and second islands are formed includes steps of providing a semiconductor wafer comprising an active zone and a dummy zone adjacent to the active zone; forming a plurality of first trenches in the semiconductor wafer, wherein the plurality of first trenches extend along a first direction; forming a plurality of second trenches in the semiconductor wafer in the active zone, wherein the plurality of second trenches extend along a second direction intersecting the first direction; and depositing an isolation material in the plurality of first trenches and the plurality of second trenches.

In some embodiments, the method further includes steps of forming a third trench in the semiconductor wafer in the dummy zone prior to the deposition of the isolation material, wherein the third trench extends in the second direction; and depositing the isolation material in the third trench.

In some embodiments, the third trench is connected to one of the plurality of second trenches.

In some embodiments, the plurality of second trenches and the third trench are formed simultaneously, and the isolation material is deposited in the third trench simultaneously with the deposition of the isolation material in the plurality of first trenches and the plurality of second trenches.

In some embodiments, the method further includes a step of performing a planarization process to remove the isolation material above an upper surface of the semiconductor wafer.

In some embodiments, the dummy zone is at or adjacent to a periphery of the active zone.

In some embodiments, the method further includes forming an access transistor in the first island prior to the deposition of the insulative layer; forming a bitline contact penetrating through the insulative layer to contact an impurity region of the access transistor; and forming a bitline on the insulative layer and connected to the bitline contact.

In some embodiments, the conductive feature and the bitline contact are formed simultaneously.

In some embodiments, the formation of the conductive feature and the bitline contact includes steps of forming a hardmask on the insulative layer; performing an etching process to remove portions of the insulative layer exposed through the hardmask and thereby form a plurality of fourth trenches to expose portions of the first and second islands; and depositing a conductive material in the plurality of fourth trenches.

In some embodiments, the conductive line and the plurality of bitlines are formed simultaneously.

In some embodiments, the method further includes steps of depositing a dielectric layer to cover the insulative layer, the bitline and the conductive wire; forming a storage node contact penetrating through the dielectric layer and the insulative layer; and forming a storage capacitor on the dielectric layer and in contact with the storage node contact.

With the above-described semiconductor device, a periphery of a cell region, which is not being used, is reserved for subsequent formation of one or more programmable resistors of peripheral circuits, and a resistive circuit comprising programmable resistors is formed simultaneously with formation of islands where memory cells are disposed, formation of bitline contacts and formation of bitlines to thereby minimize a number of processing steps necessary for fabrication of the entire device.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
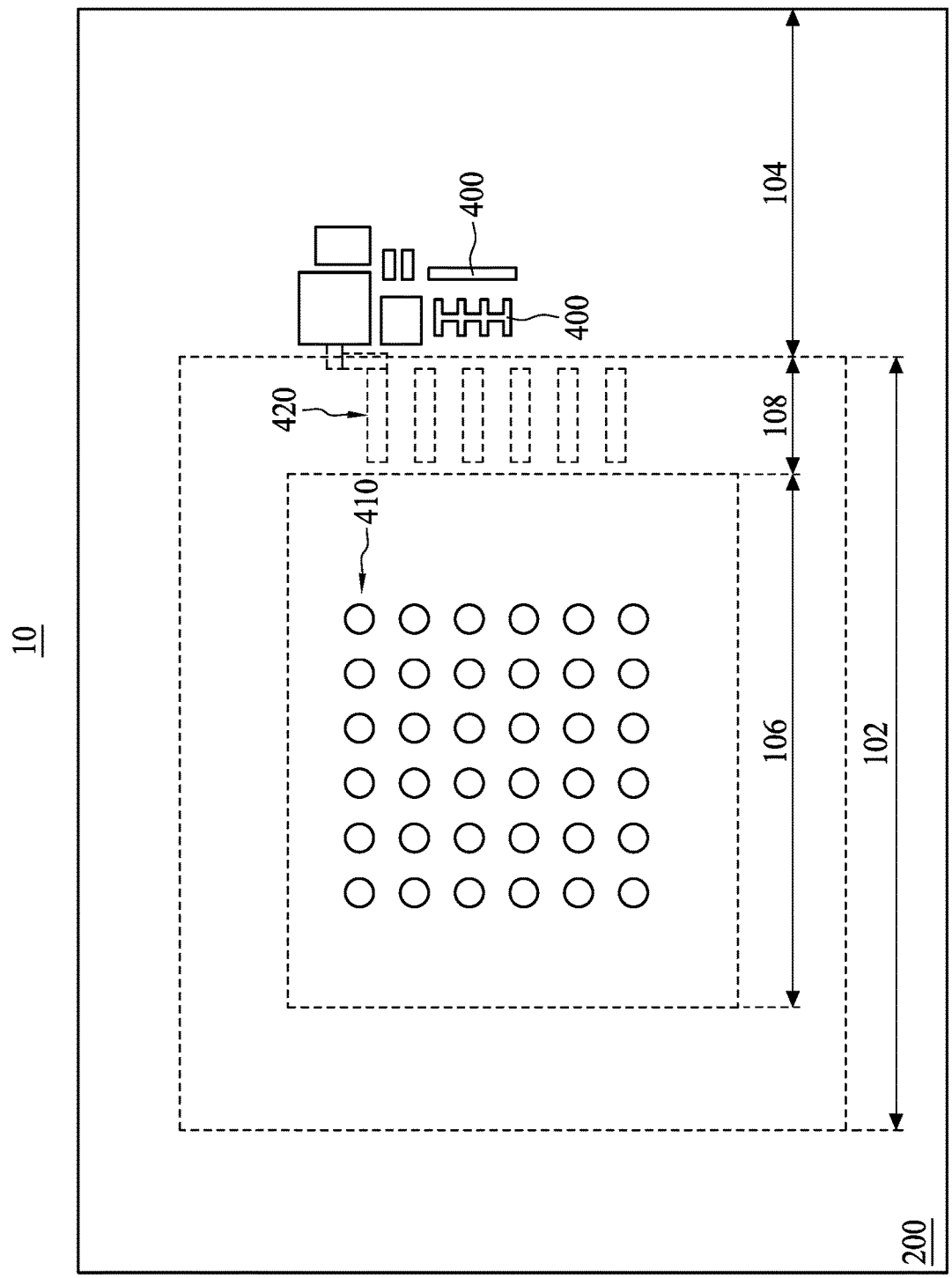
FIG. 1 is a plan view of a semiconductor chip in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
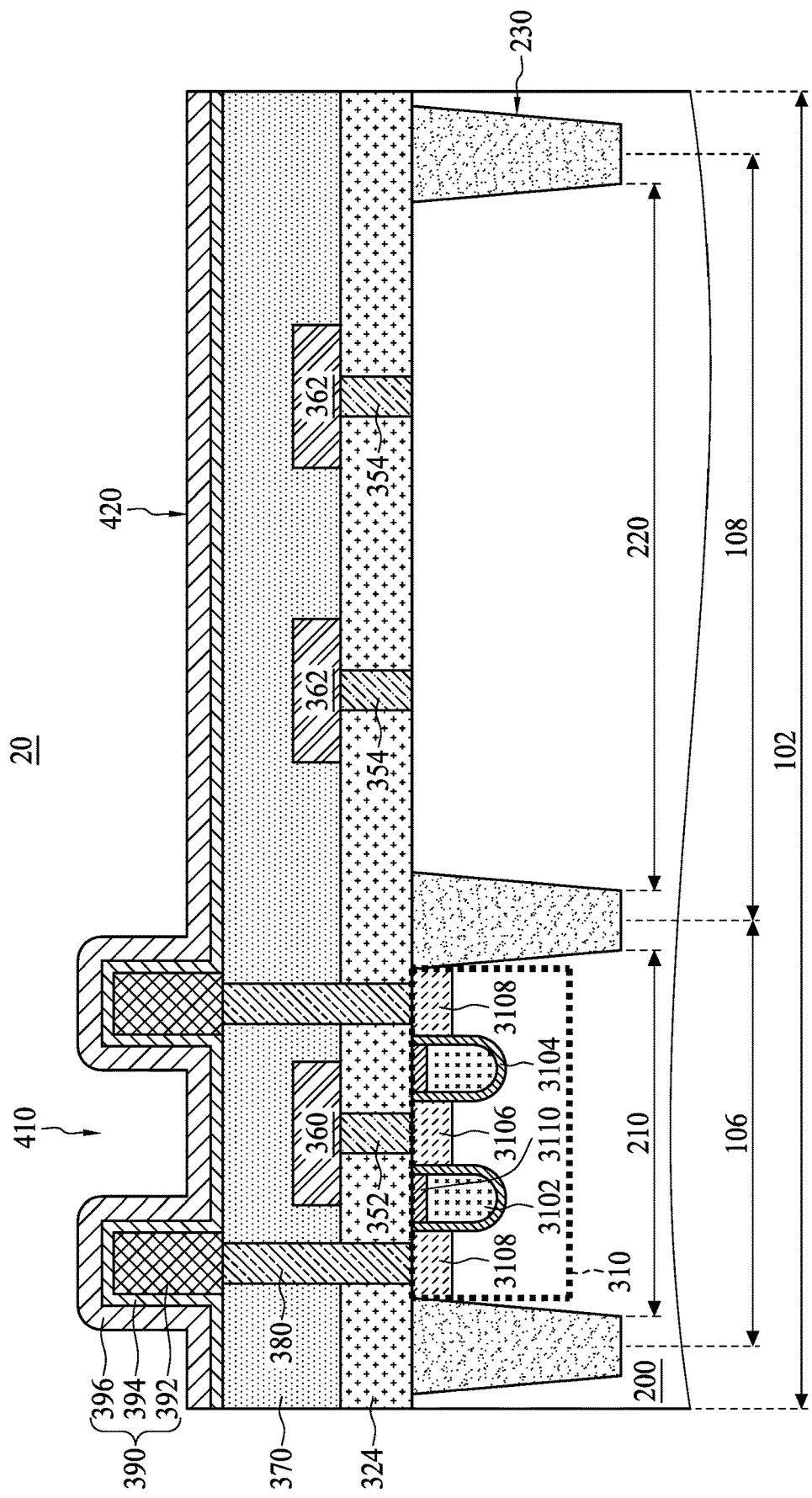
FIG. 2 is a cross-sectional view of a semiconductor device in accordance with some embodiments of the present disclosure.

FIG. 1 is a plan view of a semiconductor chip 10 in accordance with some embodiments of the present disclosure, and FIG. 2 is a cross-sectional view of a semiconductor device 20 in accordance with some embodiments of the present disclosure. Referring to FIGS. 1 and 2, the semiconductor chip 10 comprises a substrate 200 including a cell region 102 and a peripheral region 104 adjacent to the cell region 102. The cell region 102 may be a region at a center of the semiconductor chip 10, and the peripheral region 104 is arranged around the cell region 102. Additionally, the cell region 102 can further include an active zone 106 and a dummy zone 108 at or adjacent to a periphery of the active zone 106. As illustrated in FIG. 1, the dummy zone 108 is located between the active zone 106 and the peripheral region 104. In some embodiments, the dummy zone 108 laterally encloses the active zone 106.

For example, when the semiconductor chip 10 is a memory chip such as a volatile memory chip (e.g., dynamic random-access memory, static dynamic random-access memory, etc.) or a non-volatile memory chip (e.g., flash memory, electrically-erasable programmable read-only memory, etc.), the semiconductor device 20 may include a plurality of peripheral circuits 400 located in the peripheral region 104, a plurality of memory cells 410 disposed in the active zone 106, and a resistive circuit 420 disposed in the dummy zone 108. The resistive circuit 420 is electrically coupled to the peripheral circuits 400 that control operation of the memory cells 410.

The substrate 200 in the active zone 106 includes a first islands 210 where the memory cells 410 are disposed, and the substrate 200 in the dummy zone 108 includes a second island 220 that functionally acts a programmable resistor for the peripheral circuits 400. The first islands 210 has a first area, and the second island 220 has a second area greater than the first area. The resistive circuit 420 includes the second island 220 and at least one conductive feature 354 disposed on the second island 220. The resistive circuit 420 is electrically coupled to the peripheral circuit 400 through at least one conductive line 362, wherein the conductive feature 354 is disposed between the second island 220 and the conductive line 362 for electrically connecting the second island 220 to the conductive line 362.

The memory cells 410 include a plurality of access transistors 310 and a plurality of storage capacitors 390 electrically coupled to the access transistors 310, respectively. The access transistors 310, in the active zone 106, include a plurality of word lines 3102 buried in the substrate 200 and covered by a passivation layer 3110, a plurality of gate insulators 3104 disposed between the substrate 200 and the word lines 3102, and a first impurity region 3106 and a plurality of second impurity regions 3108 disposed between sides of the word lines 3102.

The first impurity region 3106 and the second impurity regions 3108 serve as drain and source regions of the access transistors 310. The first impurity region 3106 of the access transistor 310 is electrically coupled to a bitline 360 by a bitline contact 352, while the second impurity regions 3108 of the access transistor 310 are electrically coupled to the storage capacitors 390 by a plurality of storage node contacts 380 electrically isolated by an insulative layer 324 and a dielectric layer 370. In some embodiments, the bitline 360 and the conductive line 362 are disposed at a same horizontal level, and the conductive feature 354 and the bitline contact 352 are disposed at a same horizontal level.

Figure 3A:
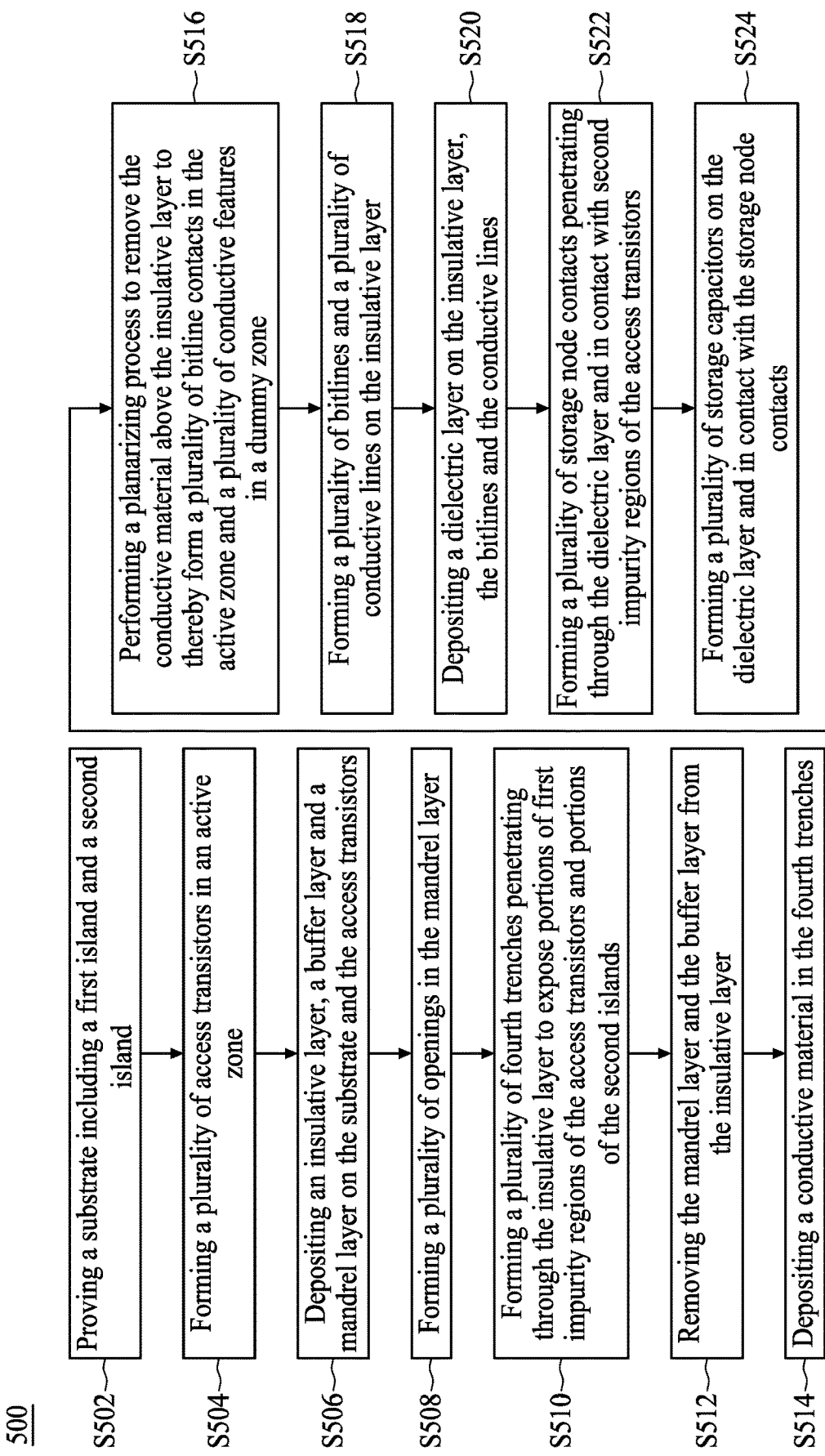
FIG. 3A is a flow diagram illustrating a method of fabricating a semiconductor device in accordance with some embodiments of the present disclosure.
Figure 3B:
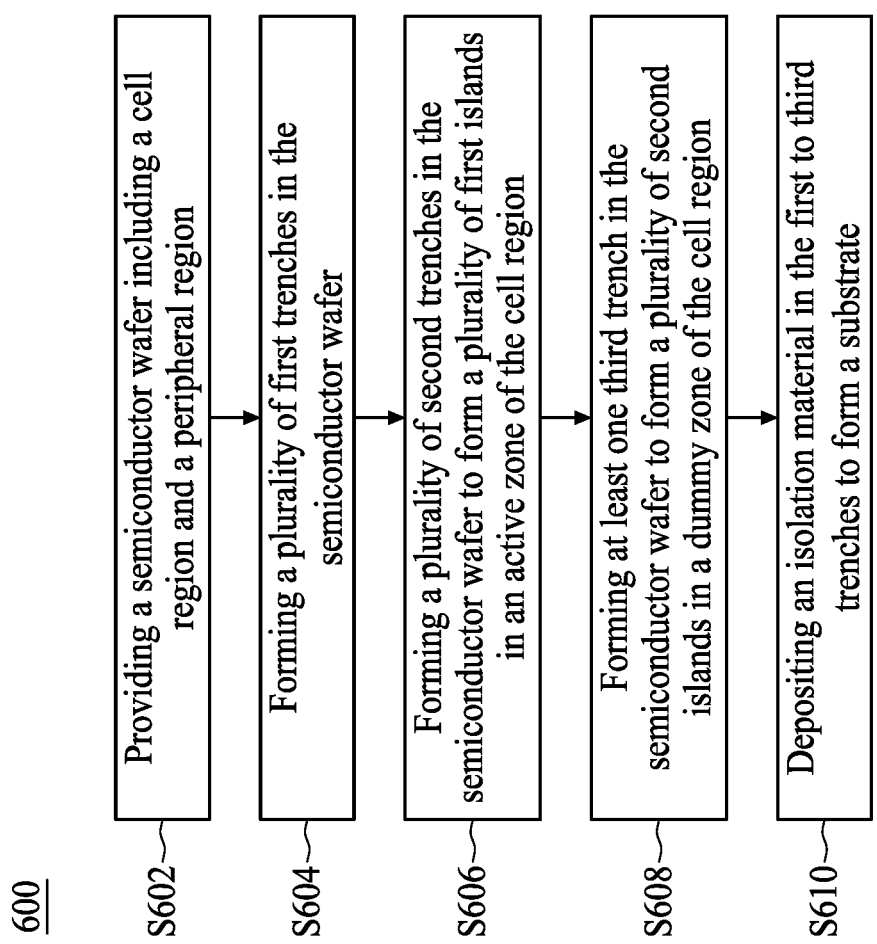
FIG. 3B is a flow diagram illustrating a method of fabricating a substrate of the semiconductor device in accordance with some embodiments of the present disclosure.

FIG. 3A illustrates a flow diagram illustrating a method 500 of fabricating a semiconductor device in accordance with some embodiments of the present disclosure, and FIG. 3B illustrates a flow diagram illustrating a method 600 of fabricating a substrate of the semiconductor device in accordance with some embodiments of the present disclosure. FIGS. 4 through 11 illustrate intermediate stages in the formation of the substrate in accordance with some embodiments of the present disclosure, and FIGS. 12 through 24 illustrate intermediate stages in the formation of the semiconductor device in accordance with some embodiments of the present disclosure. The stages shown in FIGS. 4 to 11 are referred to in the flow diagram in FIG. 3B, and the stages shown in FIGS. 12 to 24 are referred to in the flow diagram in FIG. 3A. In the following discussion, the fabrication stages shown in FIGS. 4 to 24 are discussed in reference to the process steps shown in FIGS. 3A and 3B.

Referring to FIG. 3A, the method 500 can begin at step S502, in which a substrate includes a first island and a second island is provided. The substrate including the first and second islands 210 and 220 can be formed by steps S602, S604, S606, S608 and S610 in FIG. 3B.

Figure 4:
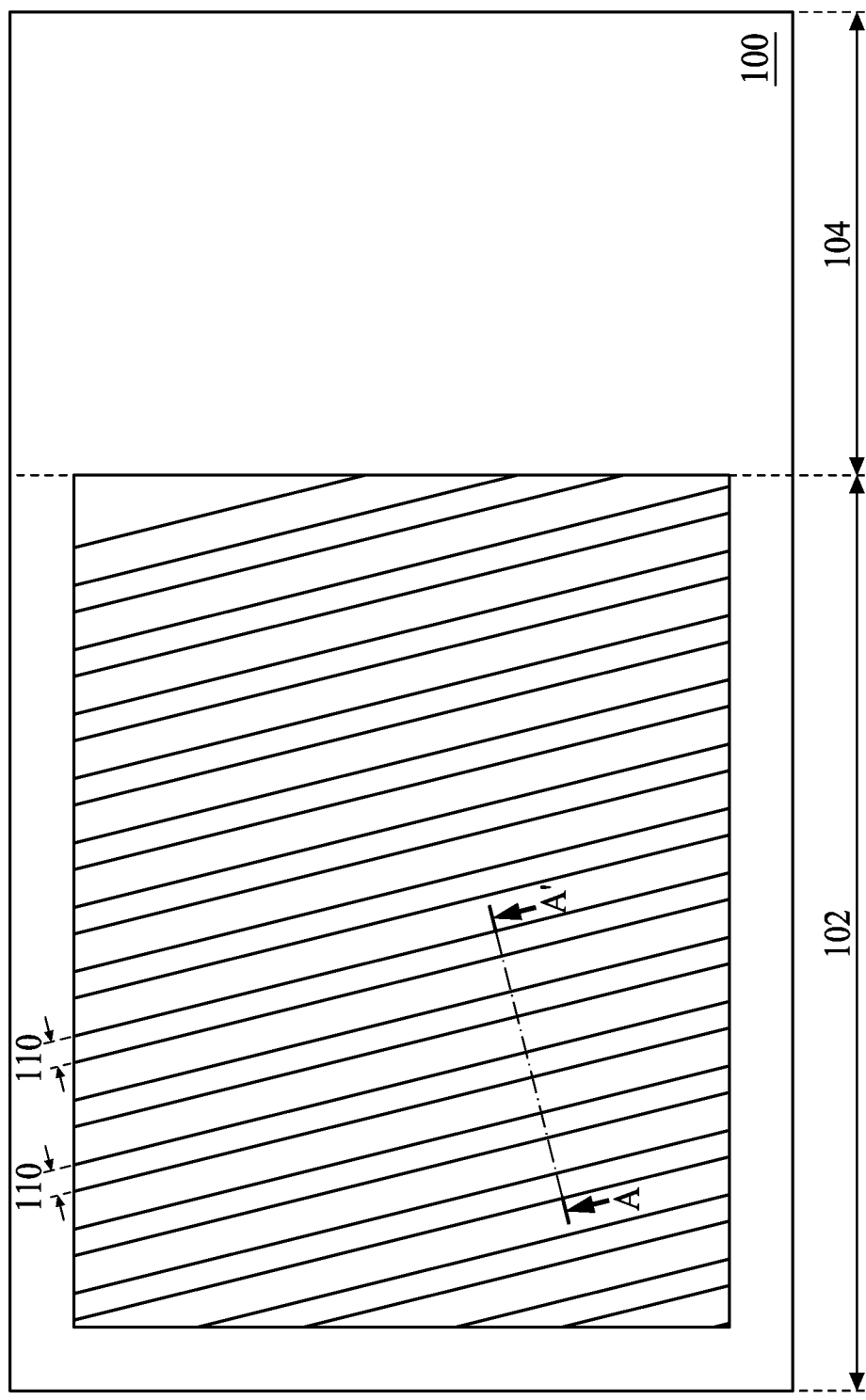
FIG. 4 is a plan view of an intermediate stage in the formation of a substrate in accordance with some embodiments of the present disclosure.
Figure 5:
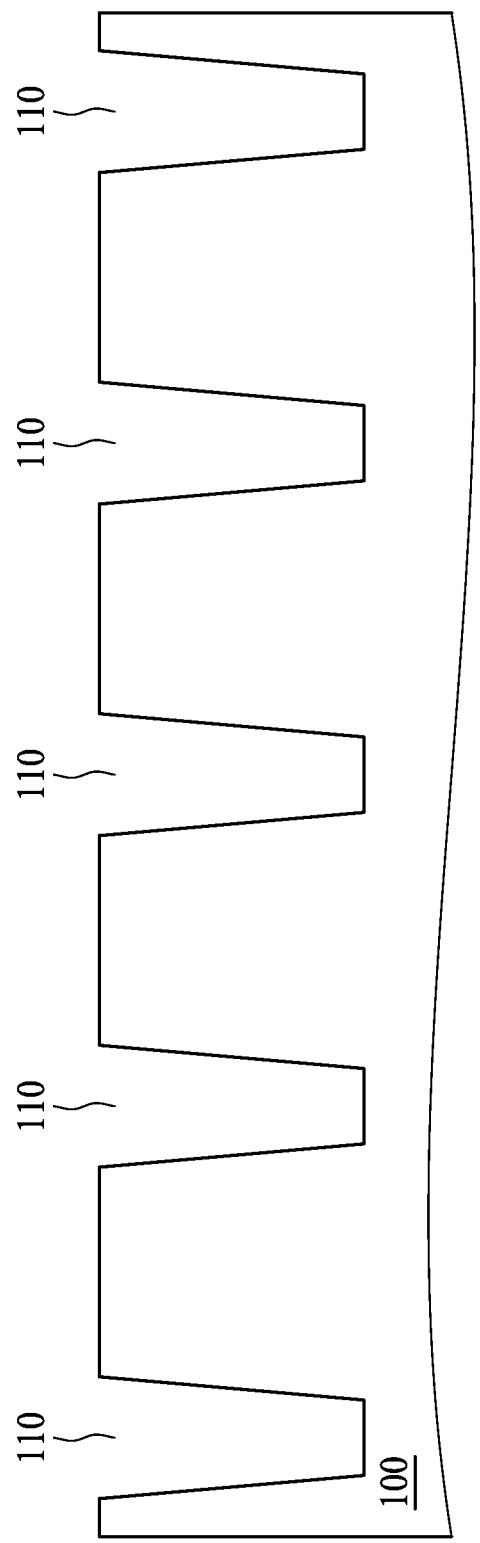
FIG. 5 is a cross-sectional view taken along a line A-A' in FIG. 4.

Referring to FIGS. 4 and 5, a semiconductor wafer 100 is provided and a plurality of first trenches 110 are formed in the semiconductor wafer 100 according to steps S602 and S604 in FIG. 3B. The semiconductor wafer 100 to be processed may be a monocrystalline silicon, while in other embodiments, the semiconductor wafer 100 may include other materials including, for example, germanium, silicon-germanium, or the like. The semiconductor wafer 100 includes a cell region 102 and a peripheral region 104 adjacent to the cell region 102. The first trenches 110 extend in a first direction D1, and are formed in the cell region 102. The first trenches 110 may be formed by steps including (1) forming a first pattern mask (not shown) on the semiconductor wafer 100, wherein the first pattern mask defines a first trench pattern to be etched into the semiconductor wafer 100, and (2) performing an etching process, such as a dry etching process, to remove a portion of the semiconductor wafer 100 not protected by the first pattern mask, thereby forming the first trenches 110 in the semiconductor wafer 100.

The first pattern mask can be a photoresist mask or a hard mask. The first pattern mask includes photosensitive material, and can be formed by performing at least one exposure process and at least one develop process on the photosensitive material that fully covers the semiconductor wafer 100, wherein the photosensitive material may be applied on the semiconductor wafer 100 by a spin-coating process and then dried using a soft-baking process. Alternatively, the first pattern mask is a hard mask, and can be made of polysilicon, carbon, inorganic materials (such as nitride) or other suitable materials. The first trench pattern may be formed in the first pattern mask using a double patterning technology (DPT) or a quadruple patterning technology (QPT) process.

Figure 6:
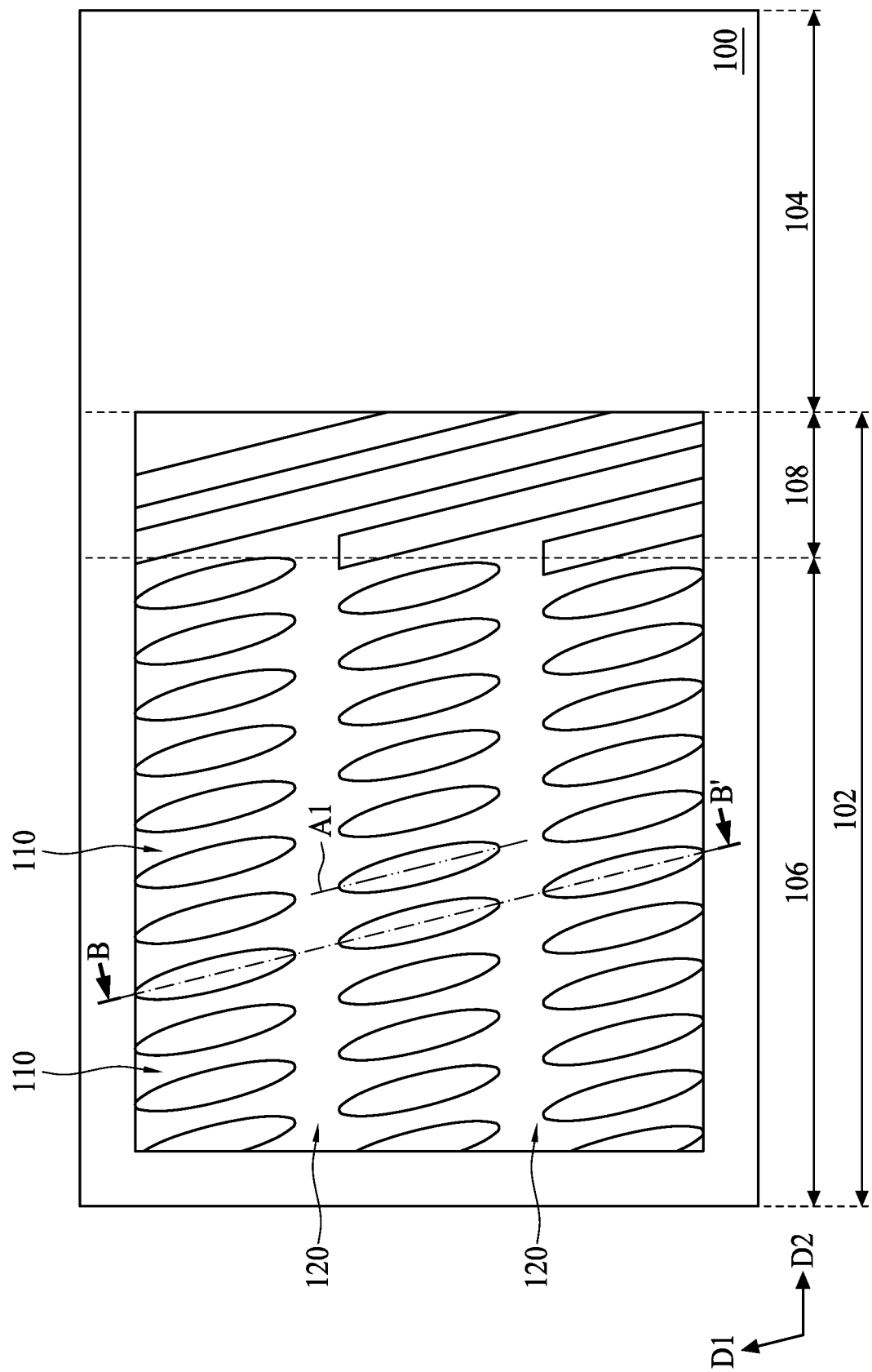
FIG. 6 is a plan view of an intermediate stage in the formation of the substrate in accordance with some embodiments of the present disclosure.
Figure 7:
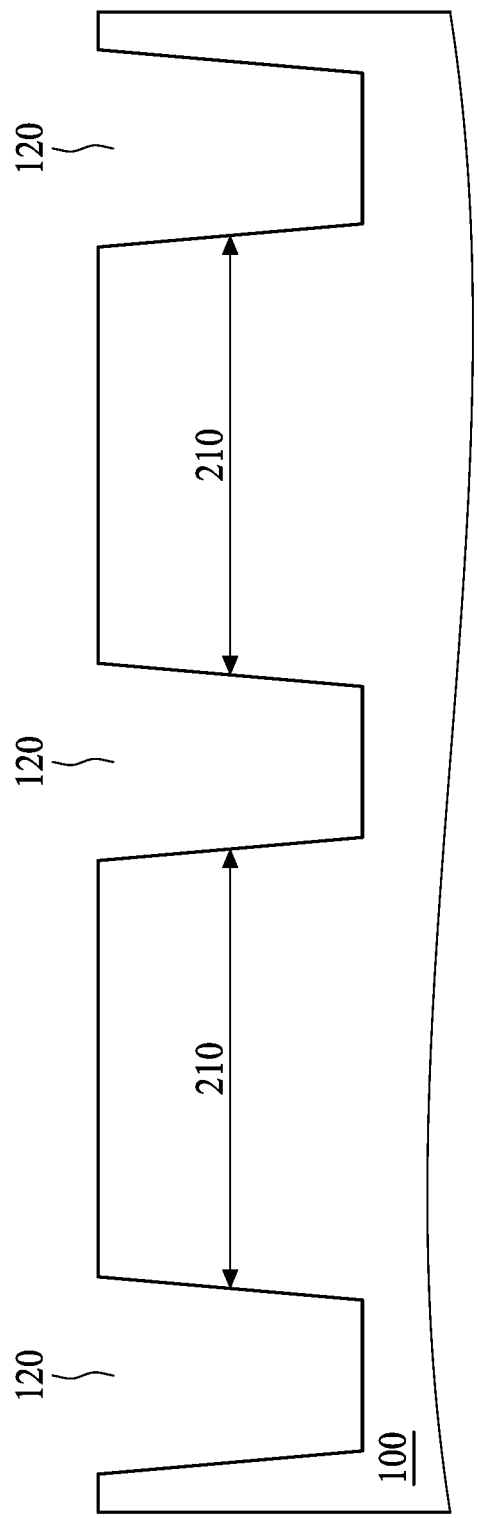
FIG. 7 is a cross-sectional view taken along a line B-B' in FIG. 6.

Referring to FIGS. 6 and 7, a plurality of second trenches 120 are formed in the semiconductor wafer 100 according to step S606 in FIG. 3B. The cell region 102 of the semiconductor wafer 100 can comprise an active zone 106 and a dummy zone 108 adjacent to the active zone 106. The dummy zone 108 is located between the active zone 106 and the peripheral region 104 of the semiconductor wafer 100. The second trenches 120 are formed in the active zone 106 of the semiconductor wafer 100 and extend in a second direction D2 intersecting the first direction D1. Therefore, after the formation of the second trenches 120, the semiconductor wafer 100 in the active zone 106 comprises a plurality of first islands 210. As illustrated in FIG. 6, each of the first islands 210 has a first longitudinal axis A1 parallel to the first direction D1. In addition, each of the first islands 210 has a first area. In some embodiments, the second trenches 120 can be formed by etching the semiconductor wafer 100 in the active zone 106 using a second trench pattern as a mask.

Figure 8:
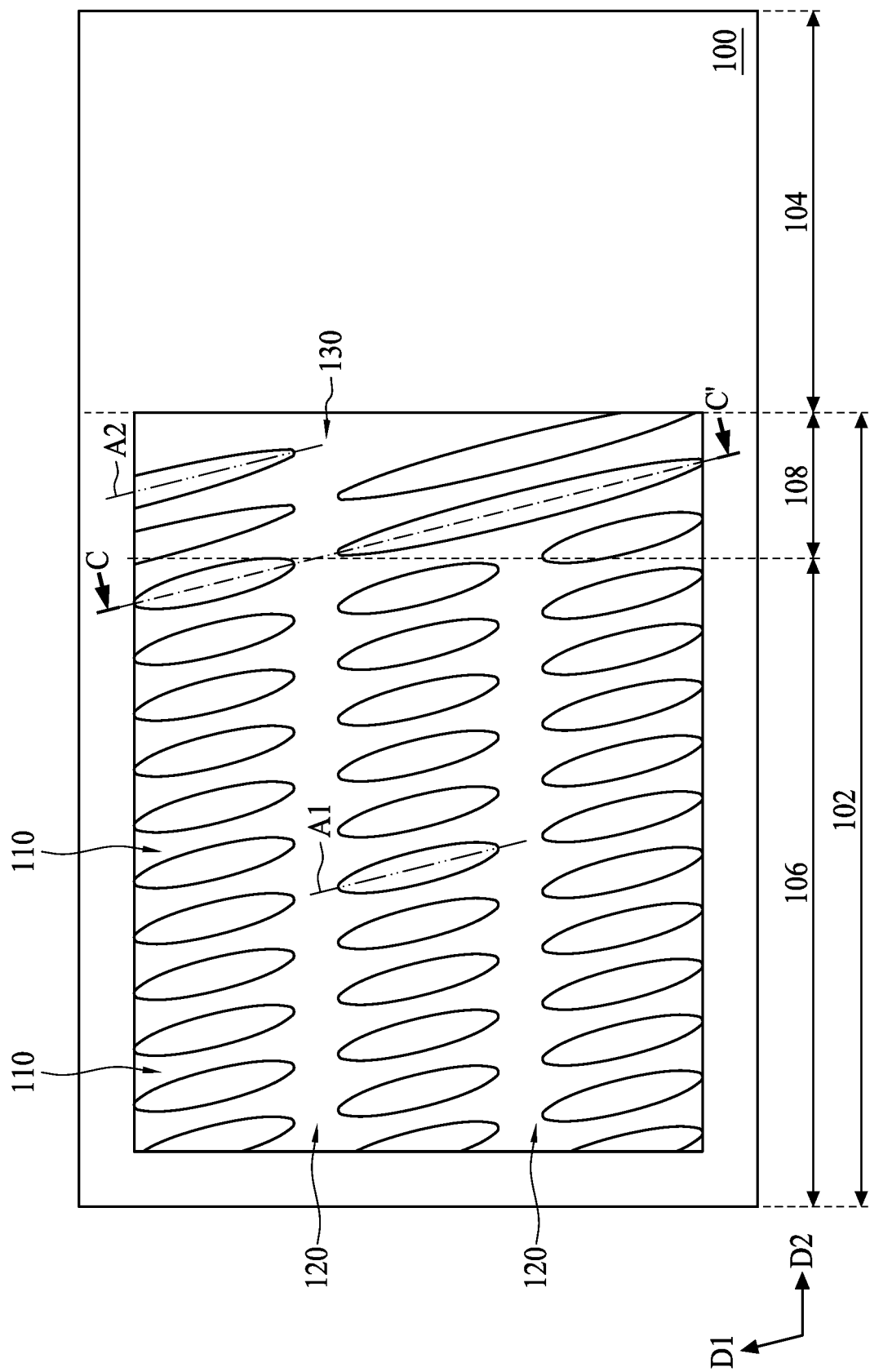
FIG. 8 is a plan view of an intermediate stage in the formation of the substrate in accordance with some embodiments of the present disclosure.
Figure 9:
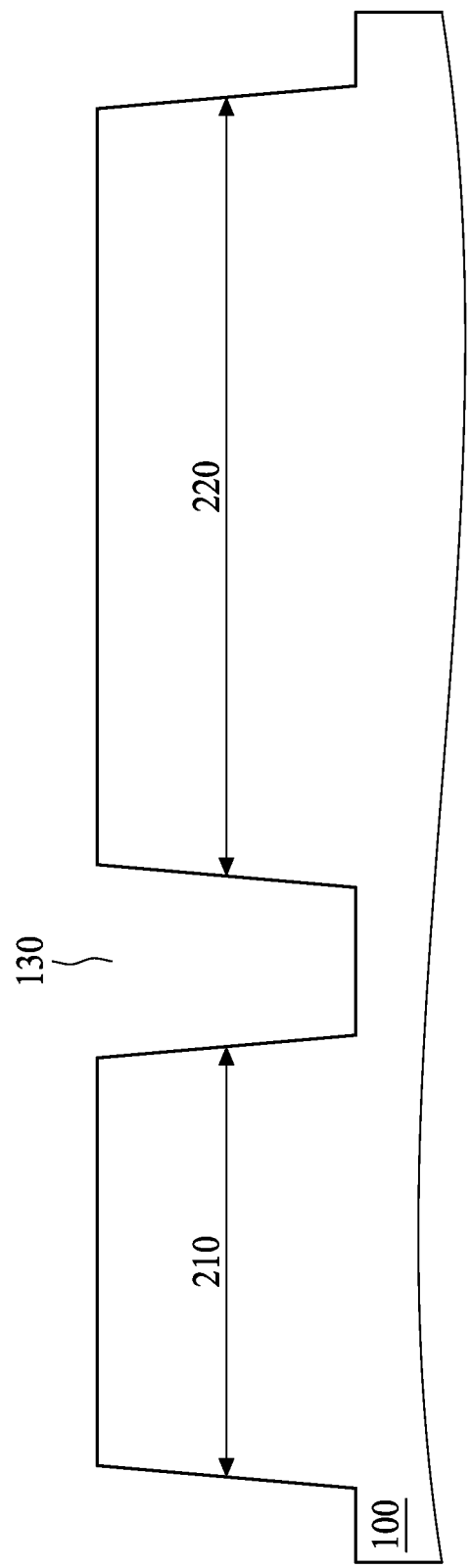
FIG. 9 is a cross-sectional view taken along a line C-C' in FIG. 8.

Referring to FIGS. 8 and 9, one or more third trenches 130 are formed in the semiconductor wafer 100 in the dummy region 108 according to step S608 in FIG. 3B. The third trenches 130 extend in the second direction D2, and a number of the third trenches 130 in the dummy zone 108 is less than a number of the second trenches 120 in the active zone 106. Therefore, after the formation of the third trenches 130, the dummy region 108 comprises a plurality of second islands 220, and each of the second islands 220 has a second area greater than the first area. In some embodiments, the second area is at least two times the first area. As illustrated in FIG. 8, the third trenches 130 in the dummy zone 108 connect to some of the second trenches 120 in the active zone 106. Each of the second islands 220 has a second longitudinal axis A2 parallel to the first direction D1. In other words, the second longitudinal axis A2 is parallel to the first longitudinal axis A1. In some embodiments, the third trenches 130 can be formed by etching the semiconductor wafer 100 in the dummy zone 108 using a third trench pattern as a mask.

Notably, the second trenches 120 and the third trenches 130 may be formed simultaneously in the semiconductor wafer 100 to reduce a number of steps in the fabrication process, thereby reducing fabrication costs and increasing quality and reliability. More particularly, the second trench pattern for the formation of the second trenches 120 in the active zone 106 and the third trench pattern for the formation of the third trenches 130 in the dummy zone 108 may be formed in an etching mask of photosensitive material or hardmask material on the semiconductor wafer 100, and then an etching process is performed to remove portions of the semiconductor wafer 100 exposed through the etching mask. In some embodiments, the first trench pattern, the second trench pattern and the third trench pattern may be formed in an etching mask, so that the first to third trenches 110 to 130 can be formed simultaneously.

Figure 10:
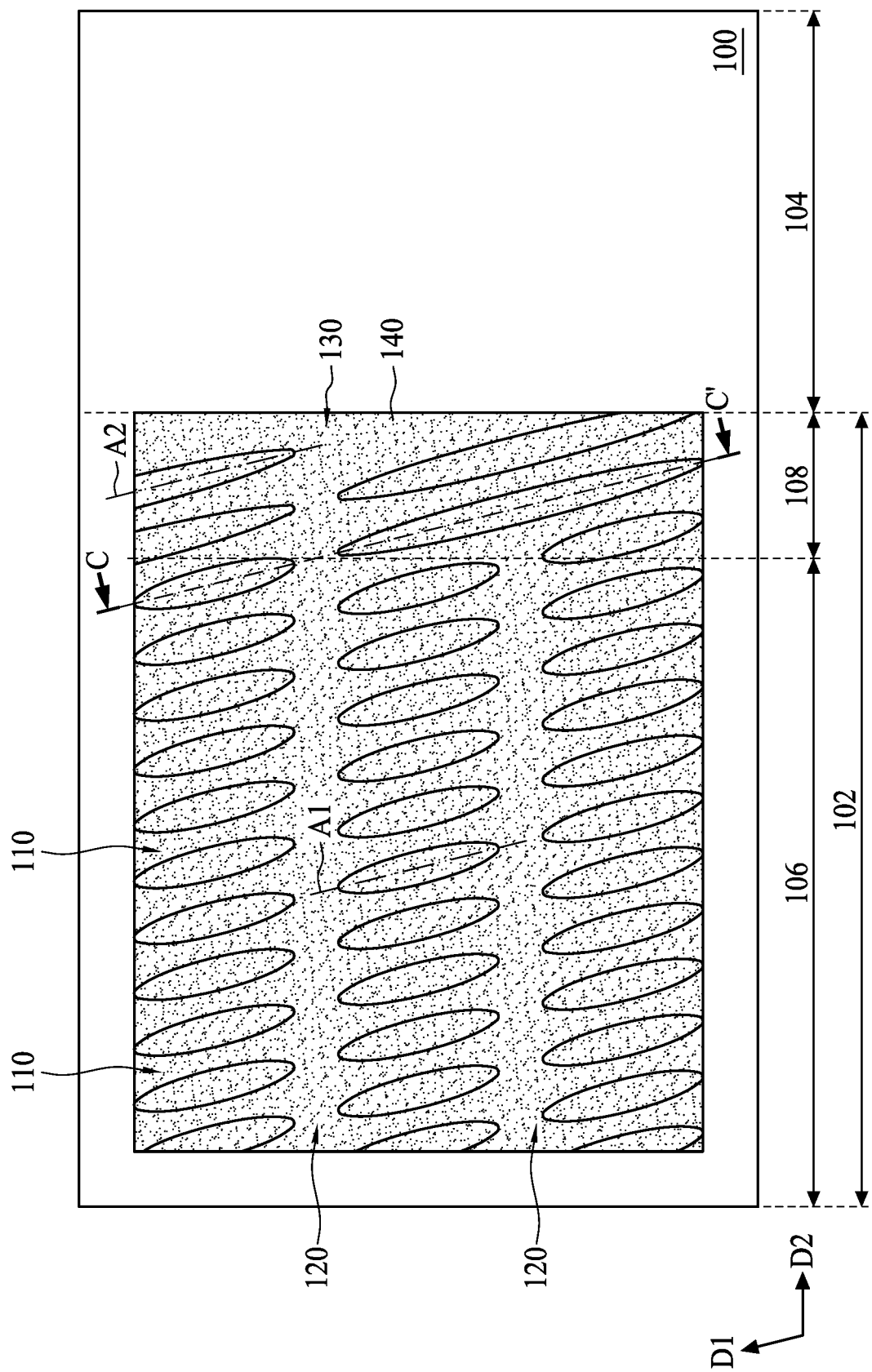
FIG. 10 is a plan view of an intermediate stage in the formation of the substrate in accordance with some embodiments of the present disclosure.

Referring to FIG. 10, an isolation material 140 is deposited in the first trenches 110, the second trenches 120 and the third trenches 130 according to step S610 in FIG. 3B. The isolation material 140 is made of dielectric material, such as silicon oxide. The isolation material 140 is deposited using a chemical vapor deposition (CVD) process such as a low-pressure CVD process or a plasma-enhanced CVD process, so that the isolation material 140 not only fills the first to third trenches 110 to 130, but also covers the semiconductor wafer 100.

Figure 11:
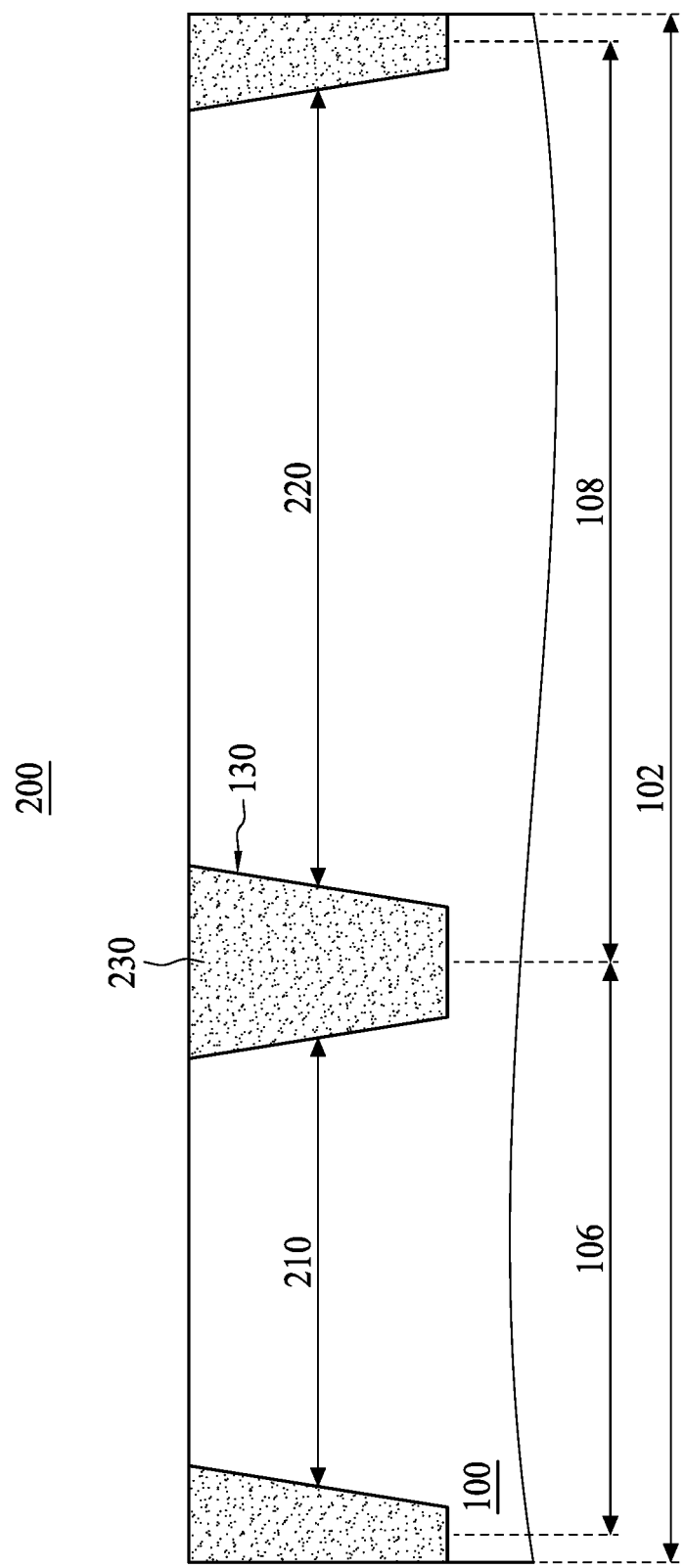
FIG. 11 is a cross-sectional view of an intermediate stage in the formation of the substrate in accordance with some embodiments of the present disclosure.

After the isolation material 140 is deposited, a planarization process is optionally performed on the isolation material 140 using any suitable method, such as an etch-back process or a chemical mechanical polishing (CMP) process, for providing better topography. After the planarization process, the substrate 200 comprising the first islands 210 in the active zone 106, the second islands 220 in the dummy zone 108, and an isolation structure 230 disposed between the first and second islands 210 and 220 is formed, as shown in FIG. 11. The isolation structure 230 is disposed between the first and second islands 210 and 220.

Figure 12:
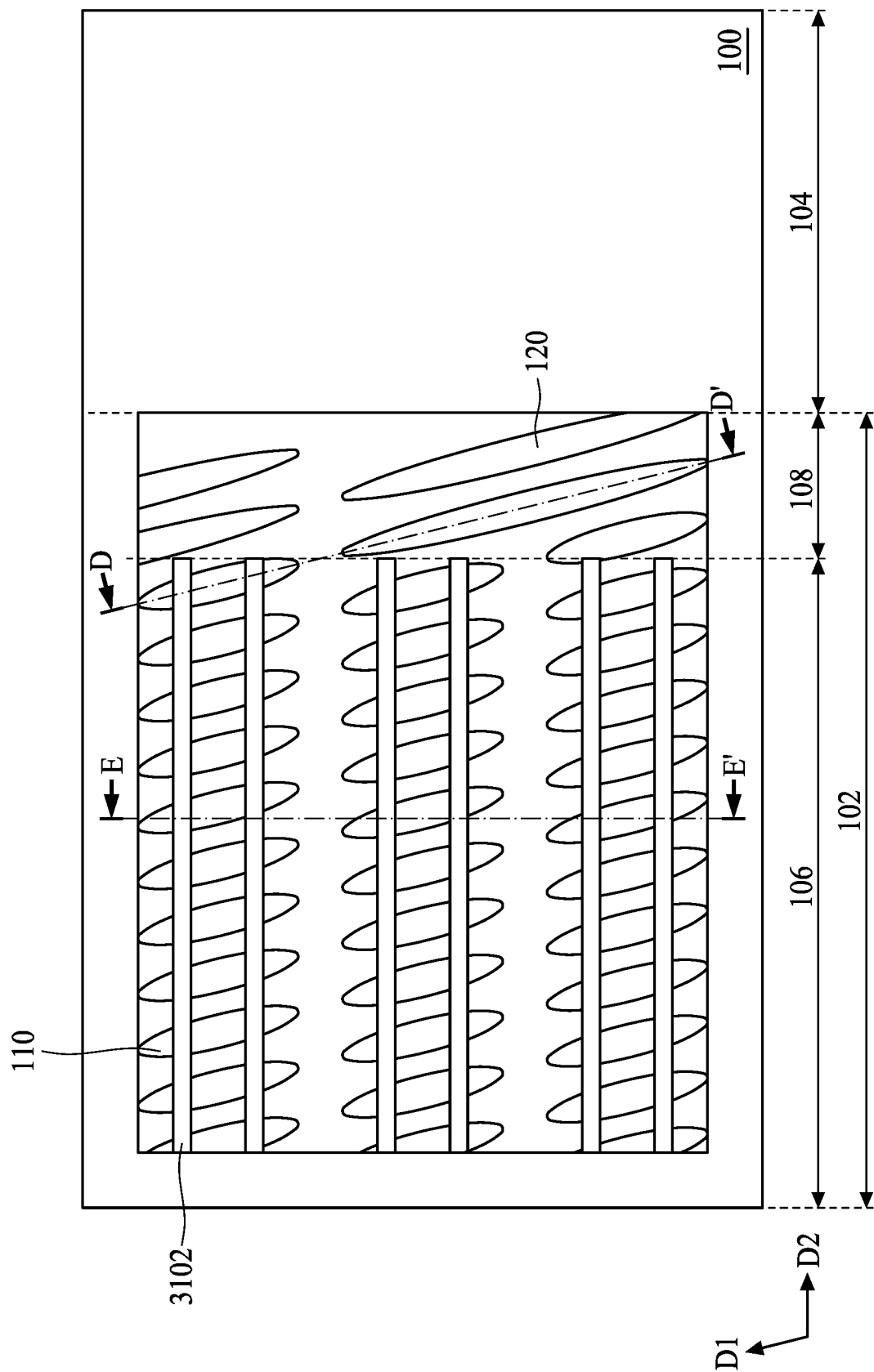
FIG. 12 is a plan view of an intermediate stage in the formation of a semiconductor device in accordance with some embodiments of the present disclosure.
Figure 13:
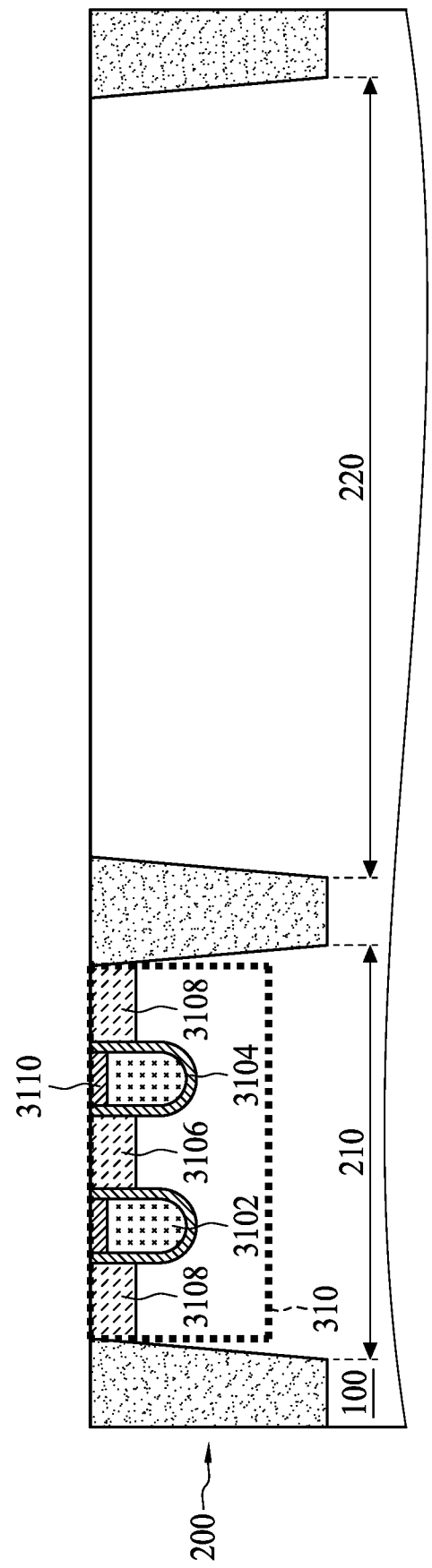
FIG. 13 is a cross-sectional view taken along a line D-D' in FIG. 12.
Figure 14:
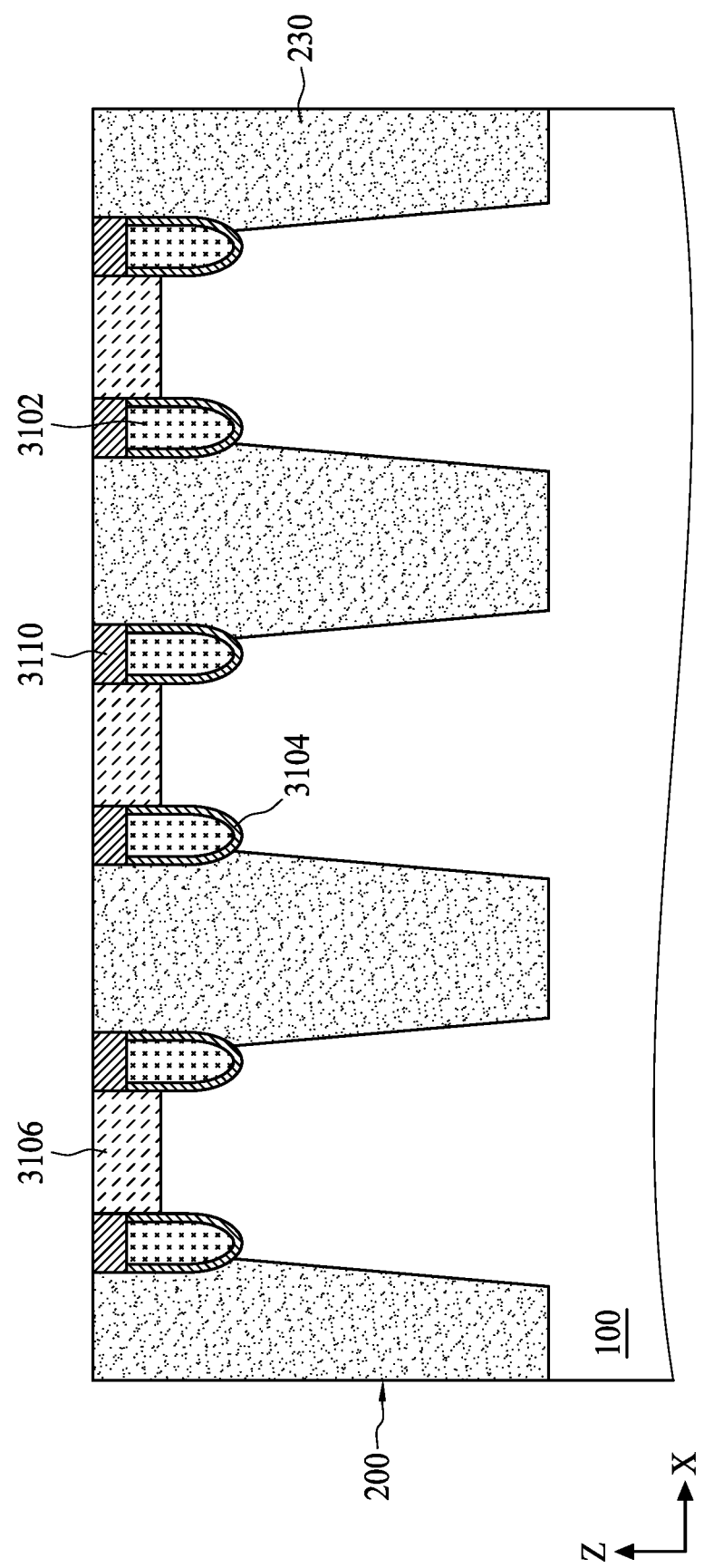
FIG. 14 is a cross-sectional view taken along a line E-E' in FIG. 12.

Referring to FIGS. 12 to 14, a plurality of access transistors 310 are formed in the substrate 200 in the active zone 106 according to step S504 in FIG. 3A. The access transistors 310 are in a form of a recessed access device (RAD) transistor; however, in some embodiments, the access transistors 310 may be planar access device (PAD) transistors. The access transistors 310 include a plurality of word lines 3102, a plurality of gate insulators 3104, a first impurity region 3106 and a plurality of second impurity regions 3108. The word lines 3102 and the gate insulators 3104 are disposed in the substrate 200, wherein the gate insulators 3104 are disposed between the semiconductor wafer 100 and the word lines 3102. As illustrated in FIG. 12, the word lines 3102 extend longitudinally along the second direction D2 and across the first islands 210 and function as gates in the access transistors 310 through which they pass. The first impurity region 3106 and the second impurity regions 3108 are disposed between sides of the word lines 3102. The access transistors 310 may further include a passivation layer 3110 disposed in the substrate 200 and used to cap the word lines 3102 and the gate insulators 3104.

Figure 15:
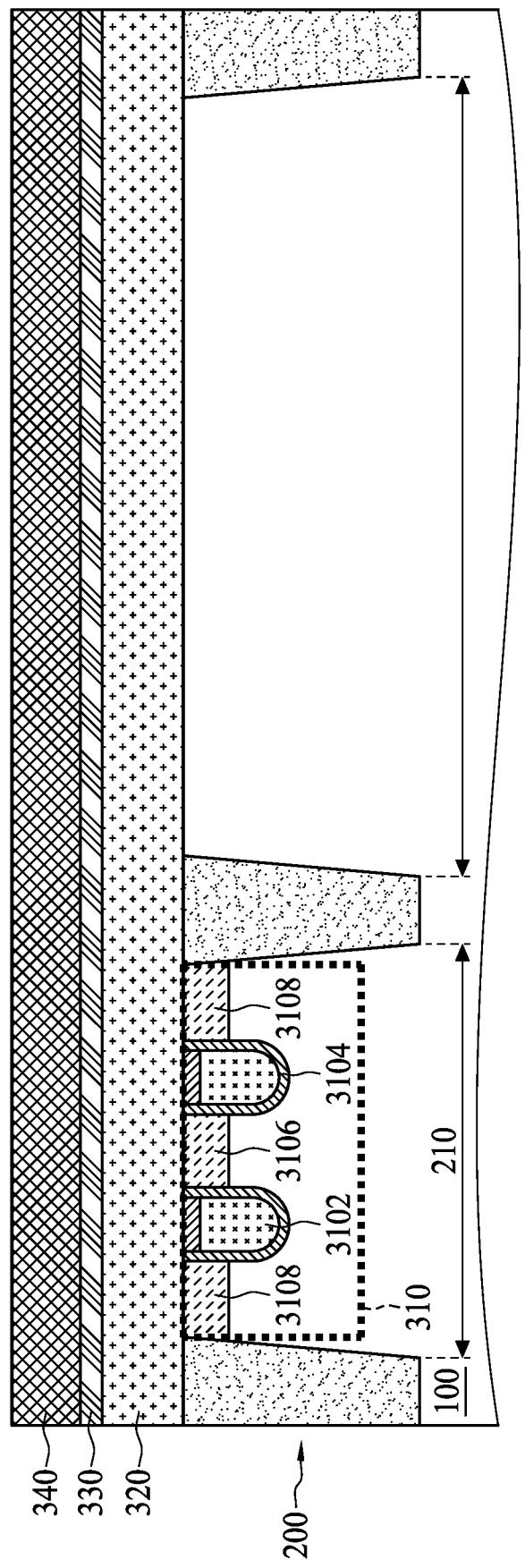
FIGS. 15 through 19 illustrate cross-sectional views of intermediate stages in the formation of the semiconductor device in accordance with some embodiments of the present disclosure.

Referring to FIG. 15, an insulative layer 320, a buffer layer 330 and a mandrel layer 340 are sequentially stacked on the substrate 200 and the access transistors 310 in the cell region 102 according to step S506 in FIG. 3A. The insulative layer 320, including dielectric material, is deposited on the substrate 200 and the access transistors 310 using a CVD process. In some embodiments, the insulative layer 320 may include oxide, tetraethylorthosilicate (TEOS), undoped silicate glass (USG), phosphosilicate glass (PSG), borosilicate glass (BSG), borophosphosilicate glass (BPSG), fluoride silicate glass (FSG), spin-on glass (SOG), tonen silazene (TOSZ), or combinations thereof. After the deposition, the insulative layer 320 may be planarized, using, for example, a chemical mechanical polishing (CMP) process, to yield an acceptably flat topology.

Because the insulative layer 320 can be mechanically weak, and may be damaged during the deposition of the mandrel layer 340, the buffer layer 330, which is mechanically stronger, is deposited on the insulative layer 320. In addition, the buffer layer 330 may also provide sufficient selectivity between the insulative layer 320 and the mandrel layer 340. In some embodiments, the buffer layer 330 can be formed of, for example, carbon-doped silicon oxide (Si-COH), which offers high etch selectivity relative to the mandrel layer 340. The buffer layer 330 is deposited on the insulative layer 320 using a CVD process, a spin-coating process or another suitable process.

The mandrel layer 340, which includes a high-hardness material, is blanketly deposited on the buffer layer 330. The mandrel layer 340 may include carbonaceous materials which are suitable for etching by various plasma-based etching process. Suitable materials which may be utilized for the mandrel layer 340 include doped and undoped amorphous carbon materials. The mandrel layer 340 may be deposited using a CVD process, a plasma-enhanced CVD process, a spin-coating process or another suitable process.

Figure 16:
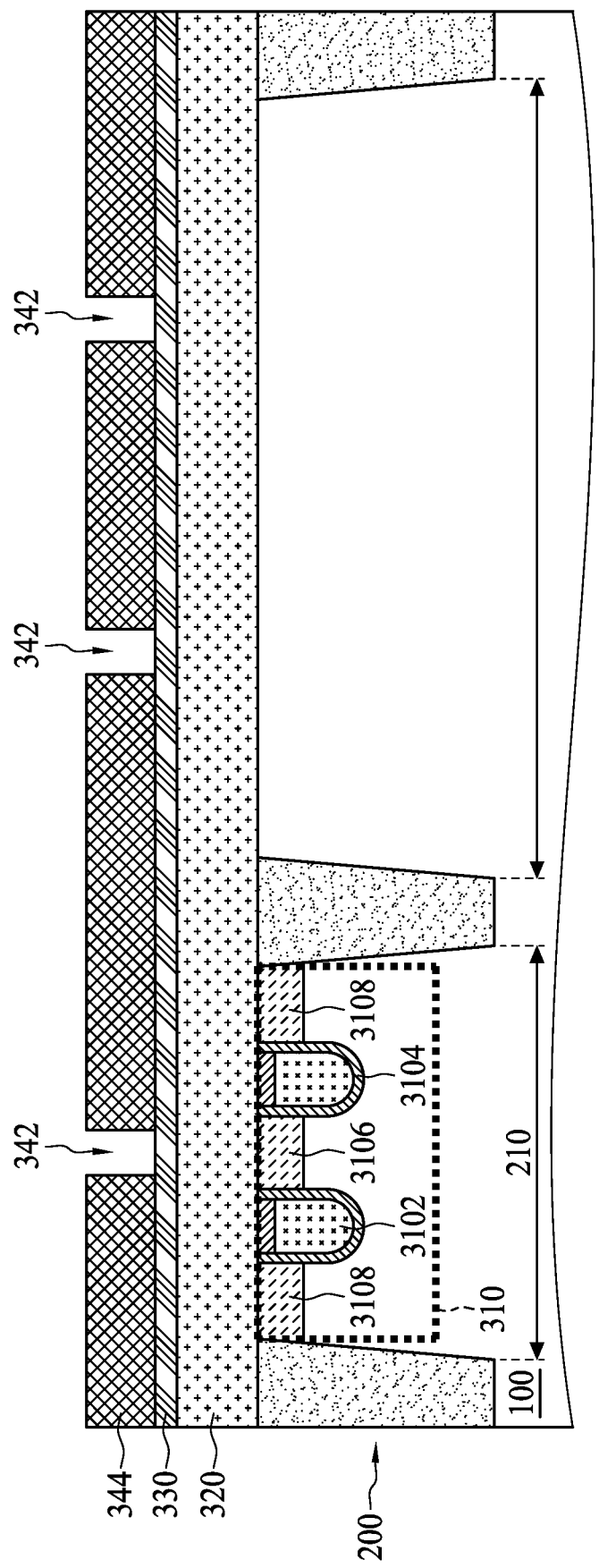

Referring to FIG. 16, one or more openings 342 are formed in the mandrel layer 340 according to step S508 in FIG. 3A. The openings 342 penetrate through the mandrel layer 340 to expose portions of the buffer layer 330. In some embodiments, the openings 342 may be formed in the mandrel layer 340 using a lithography-etch-lithography-etch (LELE) approach, for example, to form a remaining mandrel layer 344. The buffer layer 330 functions as an etch stop layer during formation of the openings 342.

Figure 17:
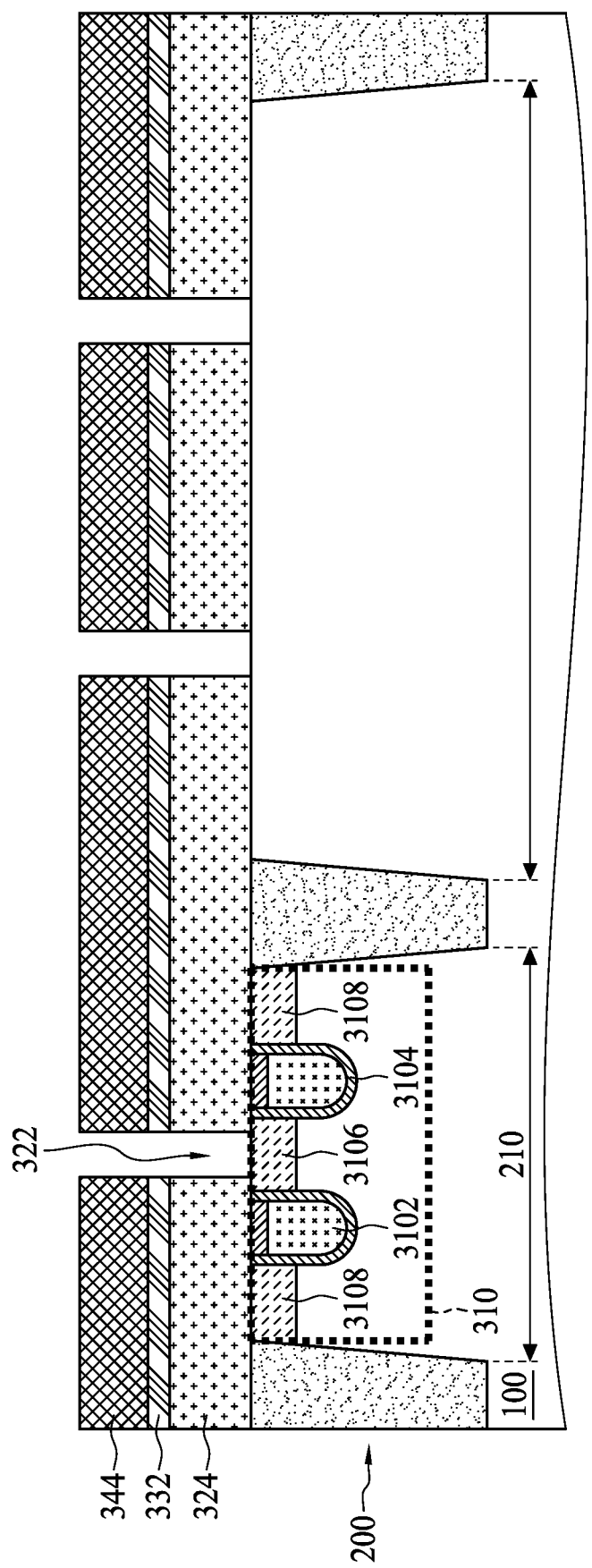

Referring to FIG. 17, one or more etching processes are performed to remove portions of the buffer layer 330 and the insulative layer 320 exposed through the openings 342 according to step S510 in FIG. 3A. Consequently, a plurality of fourth trenches 322 are formed in the insulative layer 320. As illustrated in FIG. 17, the fourth trenches 322 penetrate through the insulative layer 320, and portions of the first impurity regions 3106 in the active zone 106 and portions of the second islands 220 are exposed through the fourth trenches 322. The buffer layer 330 and the insulative layer 320 are etched using the remaining mandrel layer 344 as a hardmask to form a remaining buffer layer 332 and a remaining insulative layer 324. In some embodiments, the buffer layer 330 and the insulative layer 320 are etched using different etching processes. Alternatively, the buffer layer 330 and the insulative layer 320 may be etched using an etching step utilizing multiple etchants, selected based on the materials of the buffer layer 330 and the insulative layer 320, to sequentially etch the buffer layer 330 and the insulative layer 320.

Figure 18:
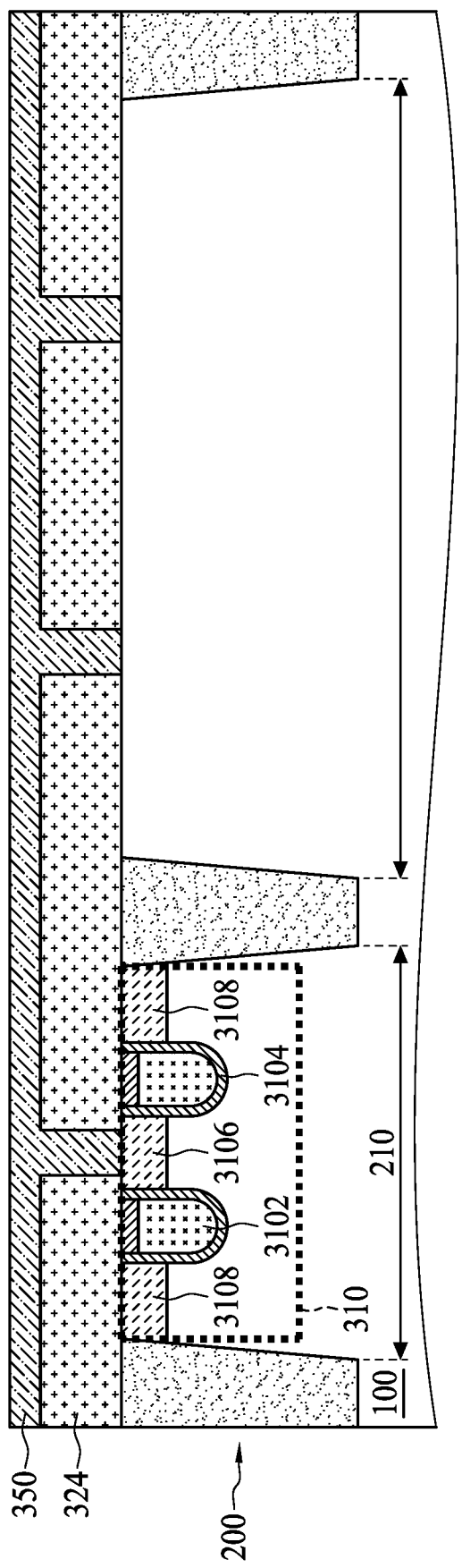

Referring to FIGS. 17 and 18, after the formation of the fourth trenches 322, the method proceeds to step S512, in which the remaining mandrel layer 344 and the remaining buffer layer 332 are removed by a suitable technique such as an ashing process and wet etching processes, resulting in the insulative layer 324 with the fourth trenches 322.

Next, a conductive material 350 is deposited in the fourth trenches 322 according to step S514 in FIG. 3A. The conductive material 350 is uniformly deposited on the insulative layer 324, the first impurity regions 3106 and the second islands 220 until the fourth trenches 322 are entirely filled. The conductive material 350 may be, for example, doped polysilicon. The conductive material 350 is deposited using a plating process or a CVD process.

Figure 19:
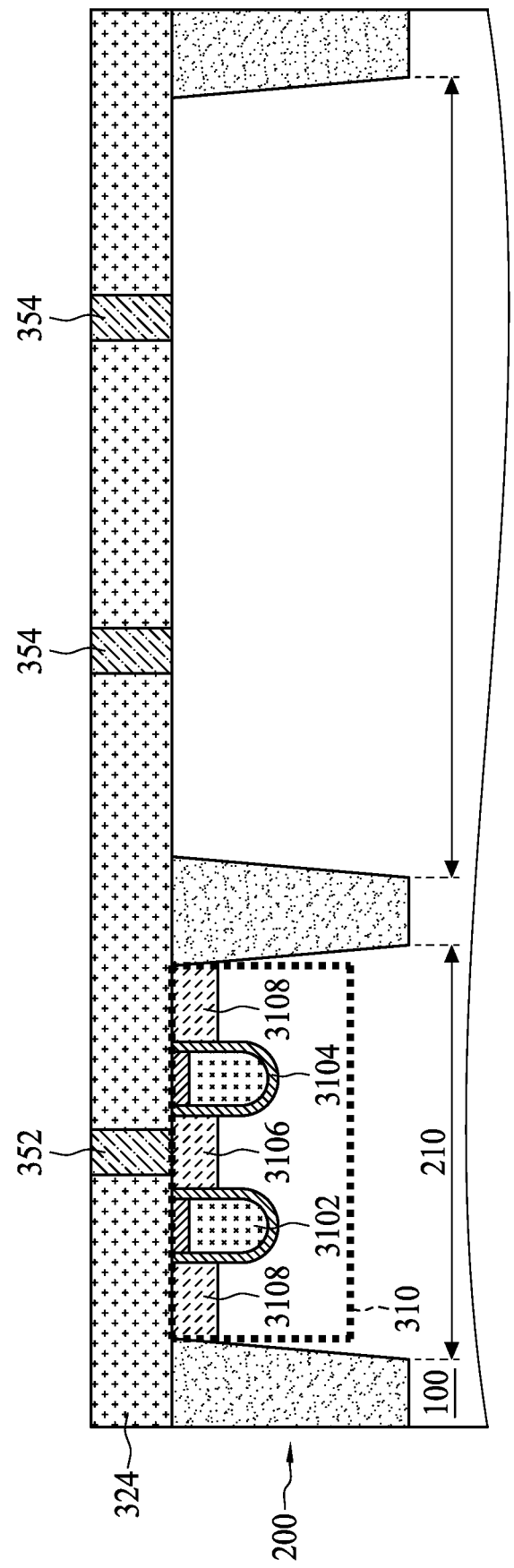

Next, the method 50 proceeds to step S516, in which a planarizing process is performed to remove the conductive material 350 above the fourth trenches 322. Consequently, a plurality of bitline contacts 352 in the active zone 106 and a plurality of conductive features 354 in the dummy zone 108, as shown in FIG. 19, are formed. After the removal of the superfluous conductive material 350, the insulative layer 324 is exposed.

Figure 20:
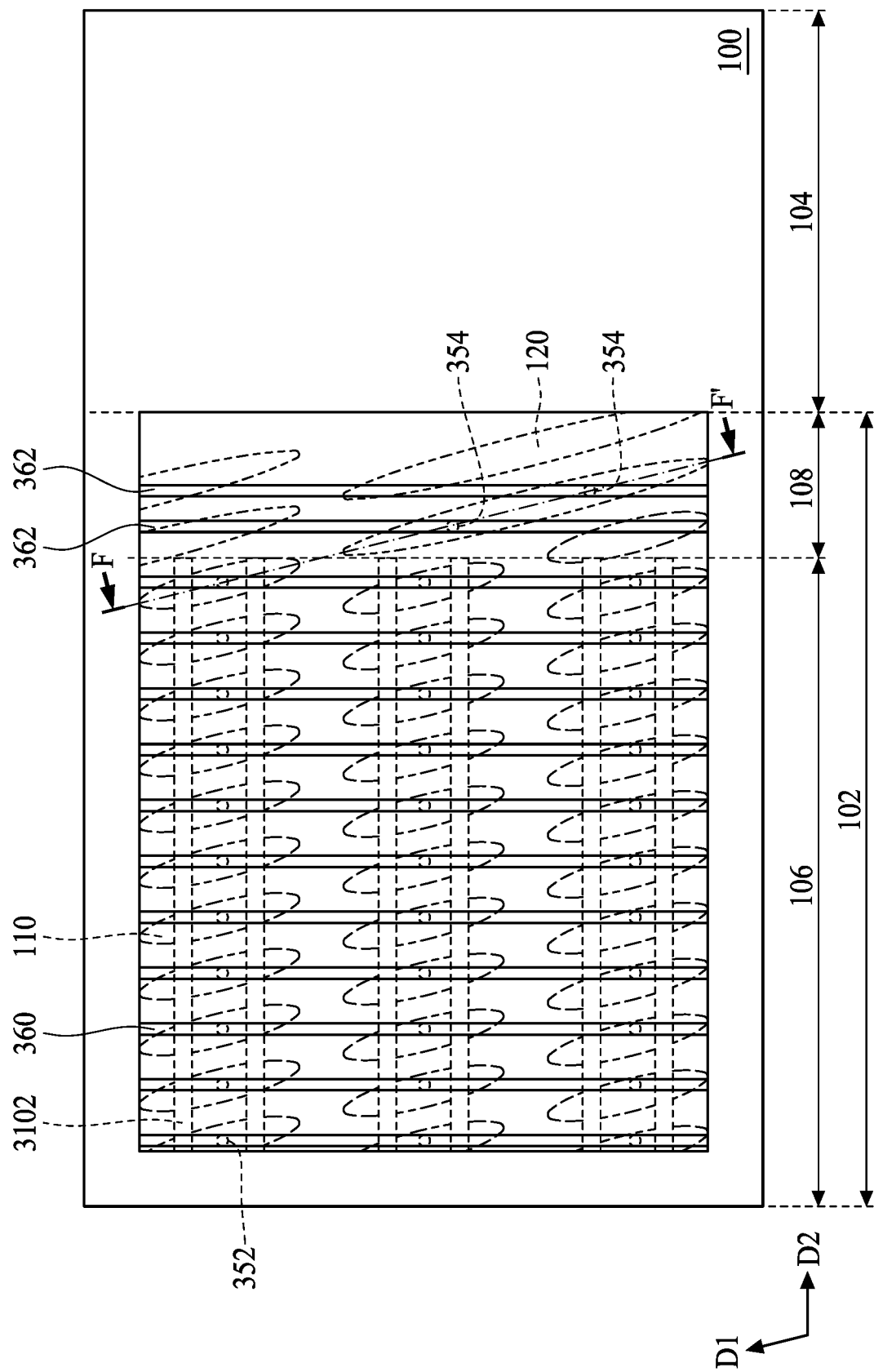
FIG. 20 is a plan view of an intermediate stage in the formation of the semiconductor device in accordance with some embodiments of the present disclosure.
Figure 21:
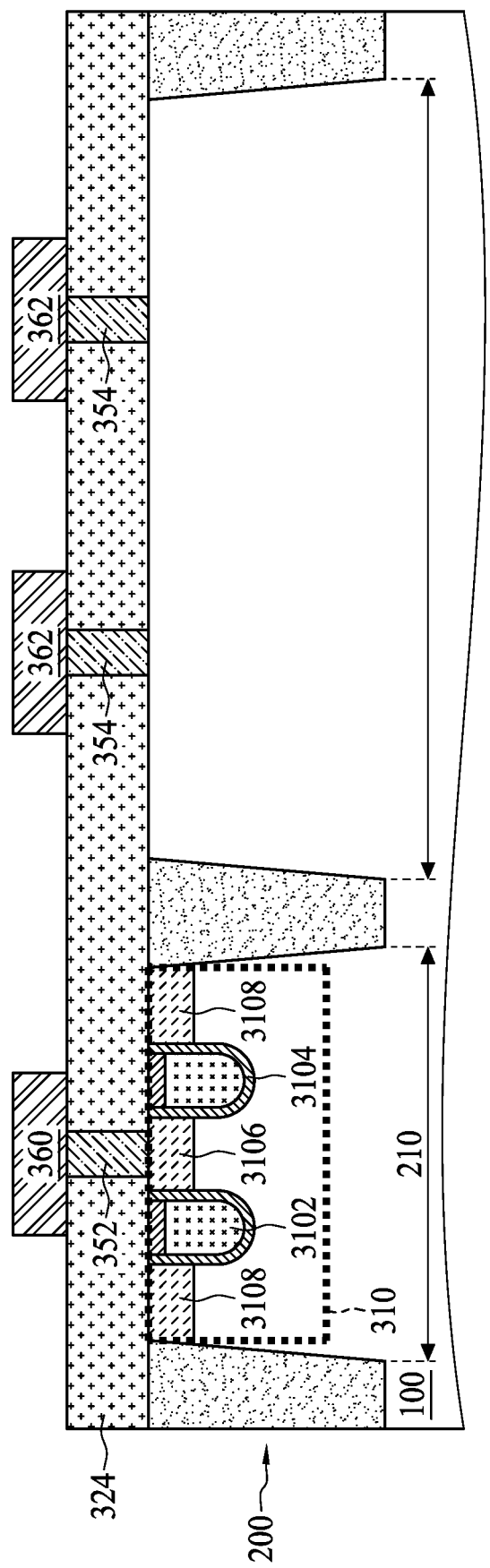
FIG. 21 is a cross-sectional view taken along a line F-F' in FIG. 12.

Referring to FIGS. 20 and 21, a plurality of bitlines 360 and a plurality of conductive lines 362 are formed on the insulative layer 324 according to step S518 in FIG. 3A. The bitlines 360 and the conductive lines 362 extend longitudinally along a third direction different from the first and second directions D1 and D2. The bitlines 360 are connected to the bitline contacts 352, and the conductive lines 362 are connected to the conductive features 354.

Figure 22:
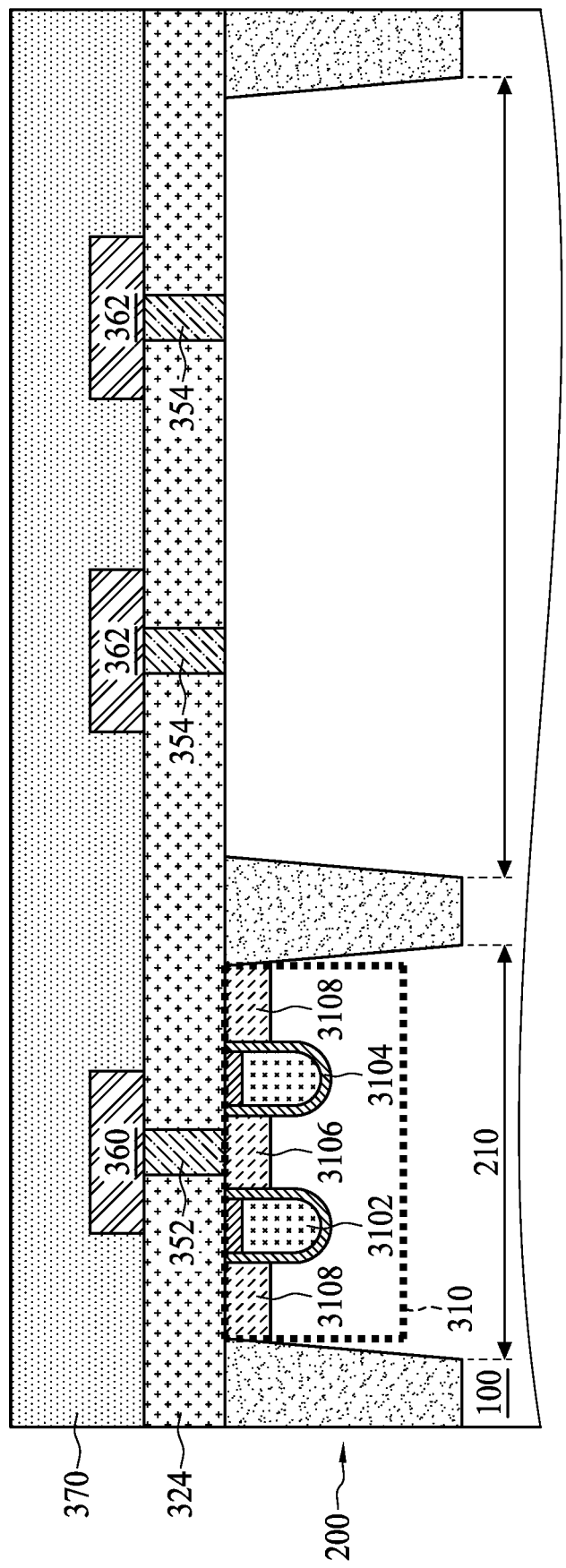
FIGS. 22 through 24 illustrate cross-sectional views of intermediate stages in the formation of the semiconductor device in accordance with some embodiments of the present disclosure.

Referring to FIG. 22, a dielectric layer 370 is deposited to cover the bitlines 360, the conductive lines 362 and the insulative layer 324 according to step S520 in FIG. 3A. The dielectric layer 370 can be formed by uniformly depositing a dielectric material using a CVD process or a spin-coating process. The dielectric layer 370 may be planarized, using, for example, a CMP process, to yield an acceptably flat topology. In some embodiments, the dielectric layer 370 is for protecting the bitlines 360 and the conductive lines 362, and may include dielectric material, such as TEOS.

Figure 23:
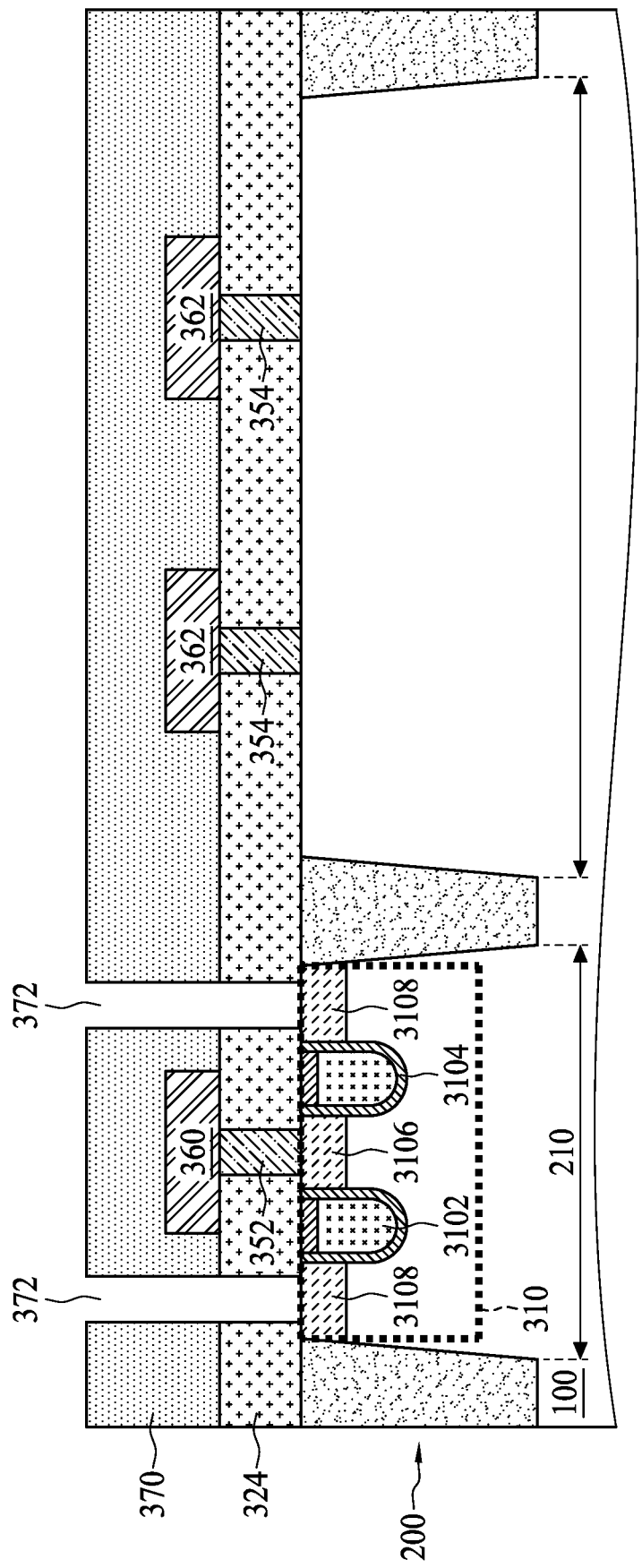
Figure 24:
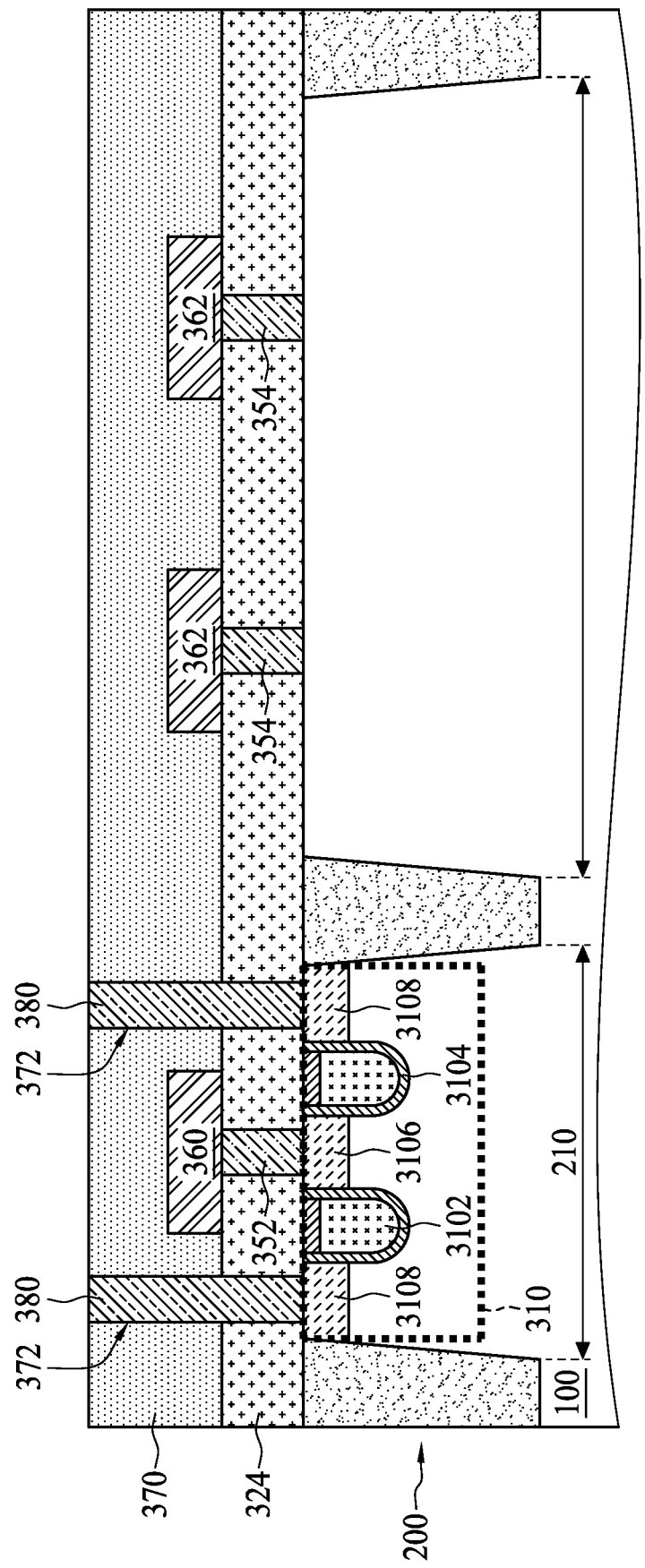

Referring to FIGS. 23 and 24, a plurality of storage node contacts 380 connected to the second impurity regions 3108 of the access transistors 310 are formed according to step S522 in FIG. 3A. The storage node contacts 380 are formed by steps including (1) forming a plurality of fifth trenches 372 penetrating through the dielectric layer 370, (2) depositing a conductive material in the fifth trenches 372, and (3) removing a portion of the conductive material above the fifth trenches 372.

Next, a plurality of storage capacitors 390 are formed on the dielectric layer 370 and the storage node contacts 380 according to step S524 in FIG. 3A. Consequently, the semiconductor device 10, shown in FIG. 2, is completely formed. The fabrication of the storage capacitors 390 involves sequentially forming a plurality of storage nodes 392 on the dielectric layer 370 and in contact with the storage node contacts 380, respectively, depositing a capacitor insulator 394 to cover the dielectric layer 370 and the storage nodes 392, and depositing a top electrode 396 on the capacitor insulator 392.

The storage nodes 392 are of a pillar shape and function as lower electrodes of the storage capacitors 390. The storage nodes 392 may be formed of doped polysilicon or metal such as titanium nitride (TiN) or ruthenium (Ru). The capacitor insulator 394 can have a topology following a topology of the storage nodes 392 and the dielectric layer 370. The capacitor insulator 394 may include silicon dioxide ($SiO_2$), silicon nitride ($Si_3N_4$), or high-k materials such as zirconium oxide ($Zr_2O_2$), hafnium oxide ($HfO_2$), titanium oxide ($TiO_2$), or aluminum oxide ($Al_2O_2$). In some embodiments, the capacitor insulator 394 may be formed of either a double film of nitride/oxide film or a triple film of oxide/nitride/oxide.

The top electrode 396 may be a substantially conformal layer and may be formed by a CVD process. The top electrode 396 may be formed of low-resistivity material, such as titanium nitride or combinations of titanium nitride, tantalum nitride (TaN), tungsten nitride (WN), ruthenium, iridium (Ir), and platinum (Pt).

In conclusion, by forming the programmable resistors necessary for the peripheral circuits 400 in the dummy zone 108 located between the active zone 106 and the peripheral region 104 of the substrate 200 simultaneously with the formation of the first islands, a number of processing steps necessary for fabrication of the entire device can be minimized.

One aspect of the present disclosure provides a semiconductor device. The semiconductor device comprises a substrate, a conductive line, a conductive feature and a plurality of memory cells. The substrate comprises a first island, a second island and an isolation structure, wherein the isolation structure is disposed between the first island and the second island. The first island has a first area, and the second island has a second area greater than the first area. The conductive line is disposed over the substrate, and the conductive feature connects the conductive line to the second island. The plurality of memory cells are disposed in or on the first island.

One aspect of the present disclosure provides a semiconductor chip. The semiconductor chip comprises a cell region, a peripheral region, a plurality of memory cells, a plurality of peripheral circuits and a resistive circuit. The cell region comprises an active zone and a dummy zone adjacent to the active zone. The peripheral region is adjacent to the cell region, and the dummy zone is located between the active zone and the peripheral region. The plurality of memory cells are located in the active zone. The plurality of peripheral circuits are located in the peripheral region. The resistive circuit is located in the dummy zone and is electrically coupled to the plurality of peripheral circuits.

One aspect of the present disclosure provides a method of manufacturing a semiconductor device. The method comprises steps of providing a substrate comprising a first island and a second island, wherein the first island has a first area, and the second island has a second area greater than the first area; depositing an insulative layer to cover the substrate; forming a conductive feature penetrating through the insulative layer and contacting the second island; and forming a conductive line on the insulative layer and connected to the conductive feature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor device, comprising:
   providing a substrate comprising a first island and a second island, wherein the first island has a first area, and the second island has a second area greater than the first area;
   depositing an insulative layer to cover the substrate;
   forming a conductive feature penetrating through the insulative layer and contacting the second island; and
   forming a conductive line on the insulative layer and connected to the conductive feature;
   wherein the substrate comprising the first and second islands is formed by:
      providing a semiconductor wafer comprising an active zone and a dummy zone adjacent to the active zone;
      forming a plurality of first trenches in the semiconductor wafer, wherein the plurality of first trenches extend along a first direction;
      forming a plurality of second trenches in the semiconductor wafer in the active zone, wherein the plurality of second trenches extend along a second direction intersecting the first direction; and
      depositing an isolation material in the plurality of first trenches and the plurality of second trenches.

2. The method of claim 1, further comprising:
   forming a third trench in the semiconductor wafer in the dummy zone prior to the deposition of the isolation material, wherein the third trench extends in the second direction; and
   depositing the isolation material in the third trench.

3. The method of claim 2, wherein the third trench is connected to one of the plurality of second trenches.

4. The method of claim 2, wherein the plurality of second trenches and the third trench are formed simultaneously, and the isolation material is deposited in the third trench simultaneously with the deposition of the isolation material in the plurality of first trenches and the plurality of second trenches.

5. The method of claim 2, further comprising performing a planarization process to remove the isolation material above an upper surface of the semiconductor wafer.

6. The method of claim 1, wherein the dummy zone is at or adjacent to a periphery of the active zone.

7. The method of claim 1, further comprising:
   forming an access transistor in the first island prior to the deposition of the insulative layer;
   forming a bitline contact penetrating through the insulative layer to contact an impurity region of the access transistor; and
   forming a bitline on the insulative layer and connected to the bitline contact.

8. The method of claim 7, wherein the conductive feature and the bitline contact are formed simultaneously.

9. The method of claim 8, wherein the formation of the conductive feature and the bitline contacts comprises:

performing an etching process to remove portions of the insulative layer exposed through a hardmask on the insulative layer to thereby form a plurality of fourth trenches to expose portions of the first and second islands; and depositing a conductive material in the plurality of fourth trenches.

10. The method of claim 7, wherein the conductive line and the plurality of bitlines are formed simultaneously.

11. The method of claim 7, further comprising:

depositing a dielectric layer to cover the insulative layer, the bitline and the conductive forming a storage node contact penetrating through the dielectric layer and the insulative layer; and forming a storage capacitor on the dielectric layer and in contact with the storage node contact.

\* \* \* \* \*